(12) United States Patent
Uchida et al.

(10) Patent No.: US 11,735,869 B2
(45) Date of Patent: Aug. 22, 2023

(54) ANTI-NOISE COMPONENT

(71) Applicant: Mitsubishi Electric Corporation, Tokyo (JP)

(72) Inventors: Takeshi Uchida, Tokyo (JP); Tetsu Owada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 272 days.

(21) Appl. No.: 17/332,102

(22) Filed: May 27, 2021

(65) Prior Publication Data

US 2021/0288448 A1    Sep. 16, 2021

Related U.S. Application Data

(63) Continuation of application No. PCT/JP2018/046807, filed on Dec. 19, 2018.

(51) Int. Cl.
*H01R 13/6591* (2011.01)
*H01R 13/622* (2006.01)
(Continued)

(52) U.S. Cl.
CPC .......... *H01R 13/6591* (2013.01); *H01R 4/26* (2013.01); *H01R 13/622* (2013.01);
(Continued)

(58) Field of Classification Search
CPC .............. H01R 13/6591; H01R 13/622; H01R 13/6596; H01R 4/26; H01R 9/0515; H01R 4/56; H01R 24/52; H05K 9/0018
See application file for complete search history.

(56) References Cited

U.S. PATENT DOCUMENTS 6,250,960 B1 *  6/2001  Youtsey .............. H01R 24/542
                                                     439/578
8,430,687 B2 *  4/2013  Zraik .................. H01R 24/542
                                                     439/578
(Continued)

FOREIGN PATENT DOCUMENTS

DE    10 2016 222 862 A1    5/2018
JP         63-55378 U       4/1988

OTHER PUBLICATIONS

Extended European Search Report dated Nov. 2, 2021 in European Patent Application No. 18 943 393.1.

*Primary Examiner* — Travis S Chambers
(74) *Attorney, Agent, or Firm* — Birch, Stewart, Kolasch & Birch, LLP

(57) ABSTRACT

An anti-noise component for a connector including a plug on an end of a coaxial cable and a jack at an opening of a metal housing of an electronic device. The anti-noise component includes a cylindrical first conductive member where the plug is inserted, and a cylindrical second conductive member where the first conductive member is inserted. The plug is held inside the first conductive member. An external thread portion is formed on the first conductive member and an internal thread portion is formed inside the second conductive member. The external thread portion mates with the internal thread portion. A flange portion is formed on the second conductive member and a joining portion is formed on the flange portion. The joining portion abuts an outer face of the metal housing. This prevents a gap from forming and leaking electromagnetic noise between the joining portion and the metal housing.

4 Claims, 21 Drawing Sheets

(51) Int. Cl.
*H01R 24/52* (2011.01)
*H01R 13/6596* (2011.01)
*H05K 9/00* (2006.01)
*H01R 4/26* (2006.01)

(52) U.S. Cl.
CPC ......... *H01R 13/6596* (2013.01); *H01R 24/52* (2013.01); *H05K 9/0018* (2013.01)

(56) References Cited

U.S. PATENT DOCUMENTS 9,863,995 B2 * 1/2018 Sako ................ G01R 31/1254
2010/0199813 A1 8/2010 Phillips et al.
2014/0295703 A1 * 10/2014 Nagashima ............ H01R 13/73
29/876

* cited by examiner

ANTI-NOISE COMPONENT

CROSS REFERENCE TO RELATED APPLICATIONS

This application is a Continuation of PCT International Application No. PCT/JP2018/046807 filed on Dec. 19, 2018, which is hereby expressly incorporated by reference into the present application.

TECHNICAL FIELD

The present invention relates to an anti-noise component.

BACKGROUND ART

In related art, electronic devices that process high-frequency signals such as radio-frequency (RF) signals have been developed. Coaxial cables are used for transmission of RF signals.

In related art, a structure in which an end portion of a coaxial cable is inserted in an opening of a metal housing of an electronic device, so that the coaxial cable is connected to the electronic device, has been developed. In this structure, a gap is formed between an outer circumferential portion of the end portion of the coaxial cable and an inner wall of the opening of the metal housing. This gap causes leakage of electromagnetic noise. As a result, there has been a problem of occurrence of electromagnetic noise in other electronic devices.

In this regard, Patent Literature 1 discloses a technology for filling the gap by using a member (hereinafter referred to as a "conductive member") made of a conductive material. This is to avoid occurrence of electromagnetic noise leakage due to the gap.

CITATION LIST

Patent Literature

Patent Literature 1: JP S63-55378 U

SUMMARY OF INVENTION

Technical Problem

According to the technology described in Patent Literature 1, an external conductor at an end portion of a coaxial cable is in contact with the conductive member, and the external conductor and the conductive member are thus electrically connected with each other. Specifically, as illustrated in FIG. 1 of Patent Literature 1, a sheath at the end portion of the coaxial cable (electric cable 12) is removed, so that the external conductor (shielding layer 12a) at the end portion of the coaxial cable is exposed. In addition, the exposed external conductor is folded. Inside the metal housing (connector case 14 made of metal), the folded external conductor is in contact with an inner interferential portion of the conductive member (conductive adapter 16).

Thus, according to the technology described in Patent Literature 1, when connecting the coaxial cable, works for removing the sheath at the end portion of the coaxial cable, works for folding the external conductor at the end portion of the coaxial cable, and the like are required. In other words, works for special processing on the end portion of the coaxial cable are required.

In addition, according to the technology described in Patent Literature 1, the external conductor at the end portion of the thus processed coaxial cable is in contact with the conductive member in the metal housing. Thus, works for opening and closing the metal housing is required in order to electrically connect the external conductor and the conductive member with each other.

As described above, the technology described in Patent Literature 1 has a problem in that works required in connecting the coaxial cable are troublesome.

The present invention has been made to solve such problems as mentioned above, and an object thereof is to provide an anti-noise component for which works required in connecting a coaxial cable are simplified.

Solution to Problem

An anti-noise component of the present invention is an anti-noise component for a connector including a plug provided on an end of a coaxial cable and a jack provided at an opening of a metal housing of an electronic device, the anti-noise component including a first conductive member having a cylindrical shape, the plug being inserted into or held by the first conductive member, and a second conductive member having a cylindrical shape, the first conductive member being inserted into the second conductive member, wherein a holder for the plug is formed on an inner circumferential portion of the first conductive member, an external thread is formed on an outer circumferential portion of the first conductive member, an internal thread is formed on an inner circumferential portion of the second conductive member, the external thread can be screwed into engagement with the internal thread portion, a flange is formed at a first end of the second conductive member, and a junction to be joined to an outer face of the metal housing is formed on the flange.

Advantageous Effects of Invention

According to the present invention, the structure as described above enables an anti-noise component for which works required in connecting a coaxial cable is simplified to be achieved.

7B is another explanatory diagram illustrating the state after the plug is inserted into the first conductive member.

Figure 8:
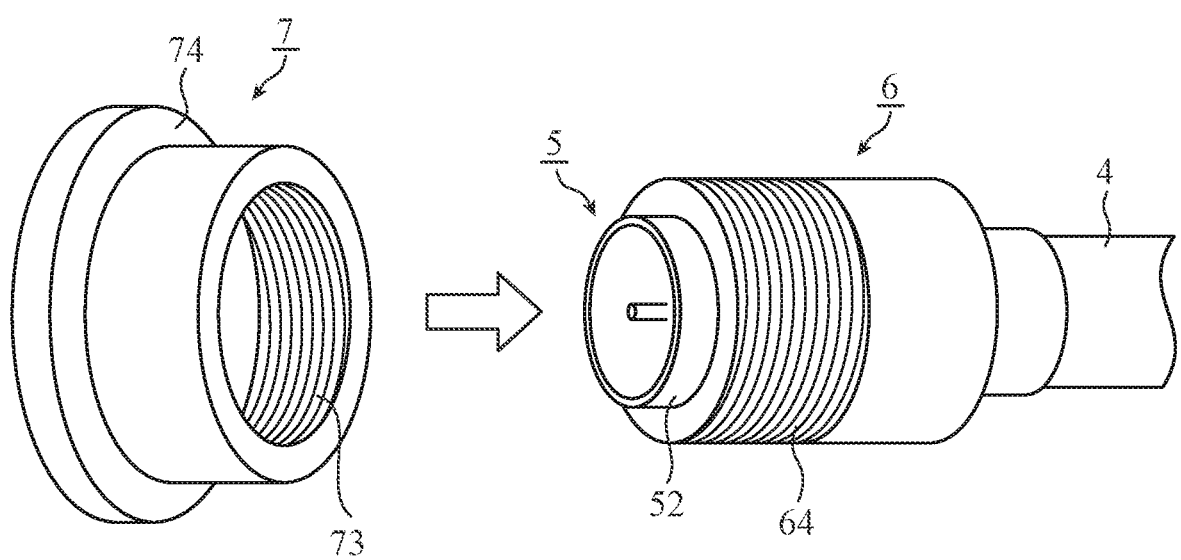

FIG. 8 is an explanatory diagram illustrating a state after the plug is inserted into the first conductive member and before the first conductive member is inserted into a second conductive member.

Figure 9A:
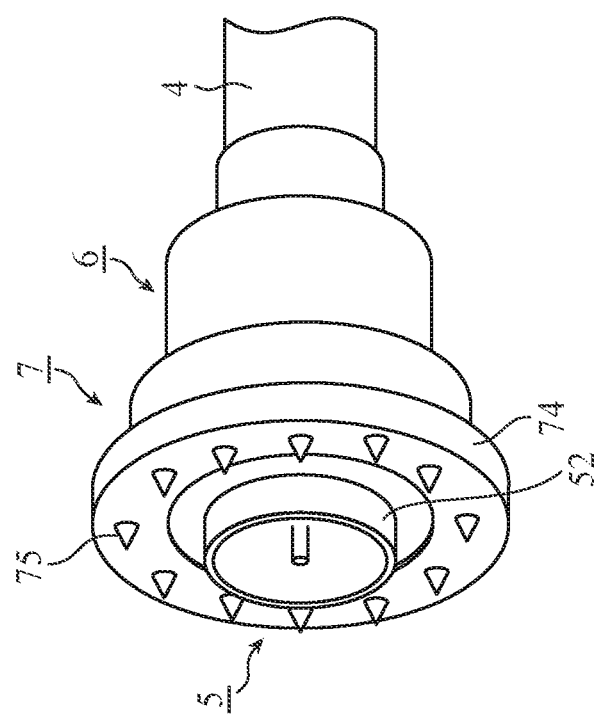
Figure 9B:
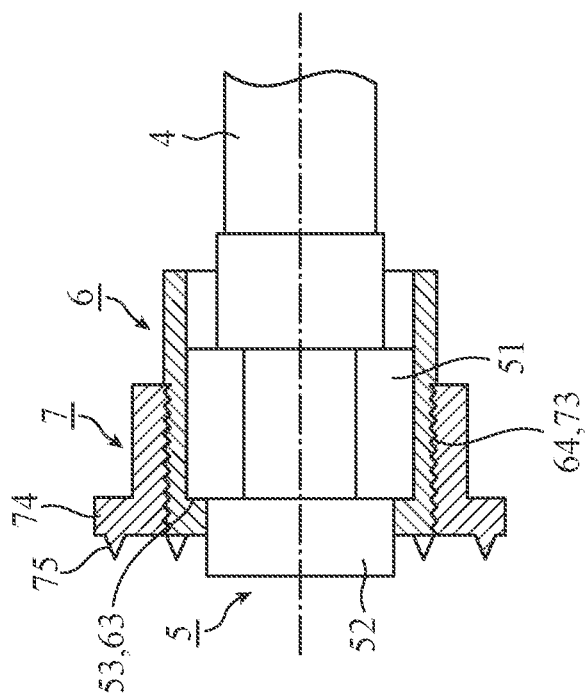

FIG. 9A is an explanatory diagram illustrating a state after the first conductive member is inserted into the second conductive member. FIG. 9B is another explanatory diagram illustrating the state after the first conductive member is inserted into the second conductive member.

Figure 10:
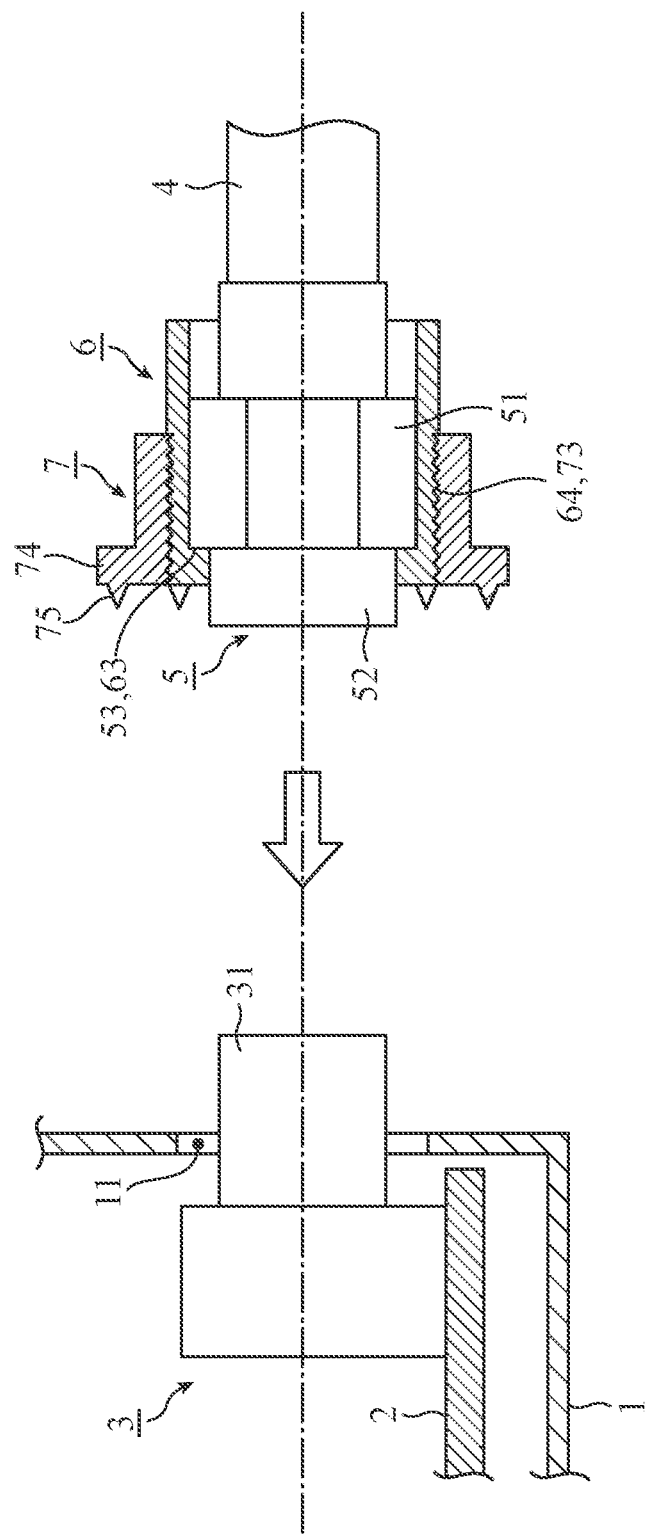

FIG. 10 is an explanatory diagram illustrating a state after the first conductive member is inserted into the second conductive member and before the plug is connected to the jack.

Figure 11:
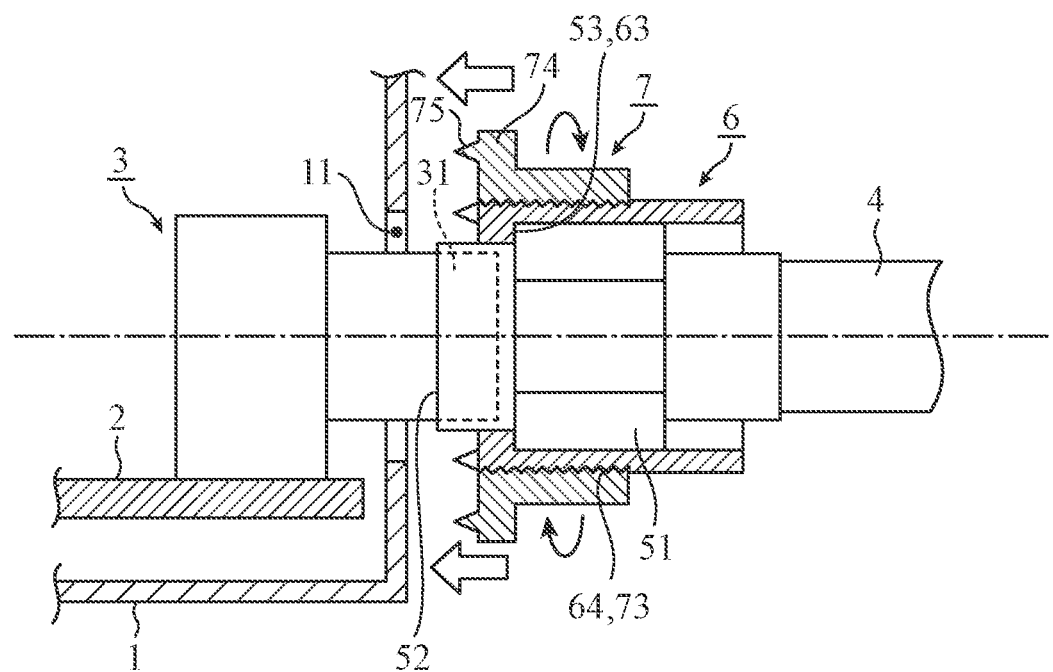

FIG. 11 is an explanatory diagram illustrating a state after the plug is connected to the jack and before the second conductive member is joined to a metal housing.

Figure 12:
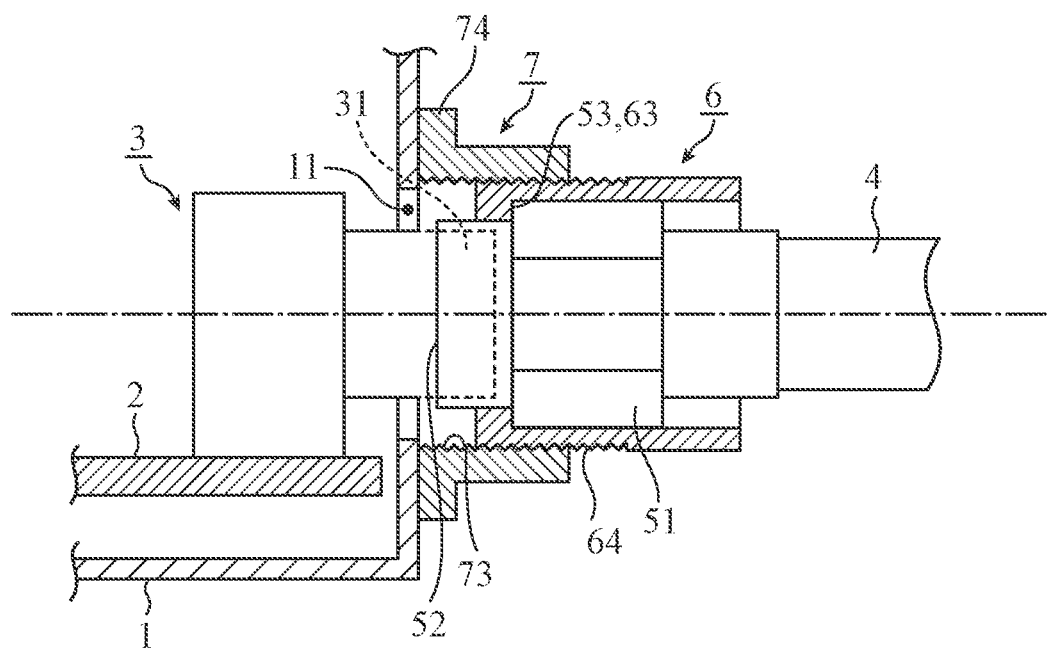

FIG. 12 is an explanatory diagram illustrating a state after the plug is connected to the jack and after the second conductive member is joined to the metal housing.

Figure 13:
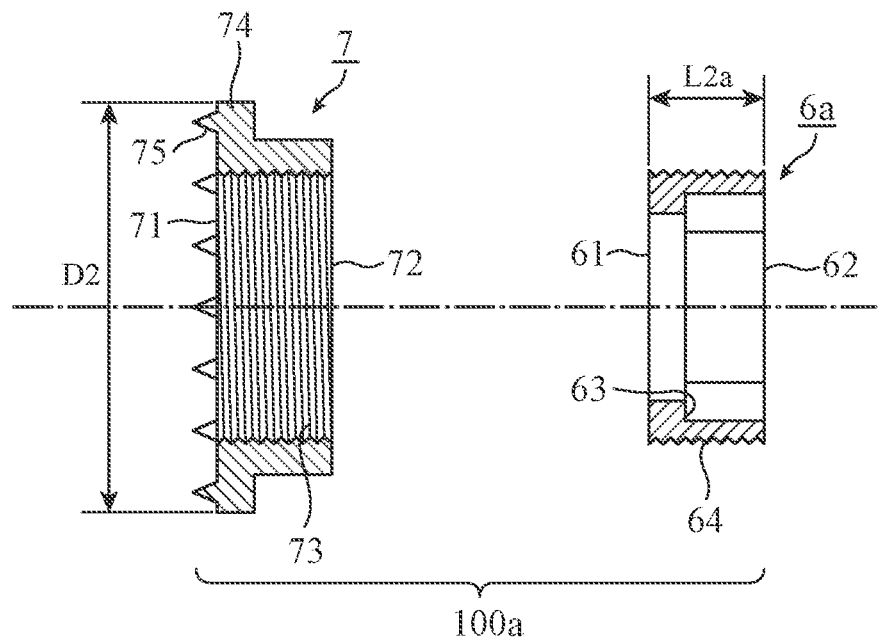

FIG. 13 is an exploded sectional view illustrating a main part of an anti-noise component according to a second embodiment.

Figure 14:
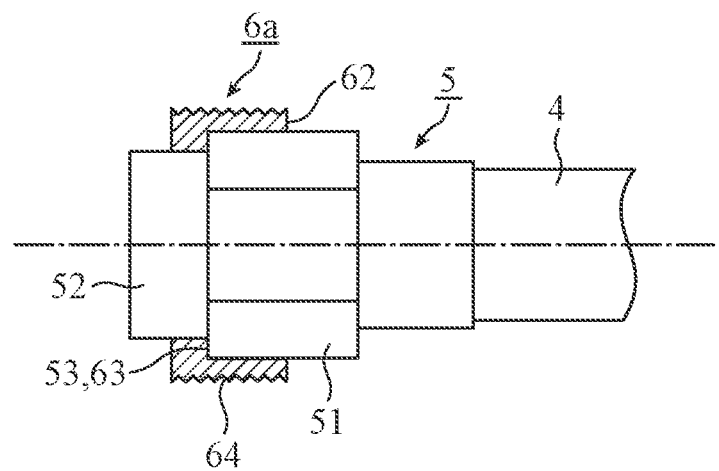

FIG. 14 is an explanatory diagram illustrating a state after a plug is inserted into a first conductive member.

Figure 15:
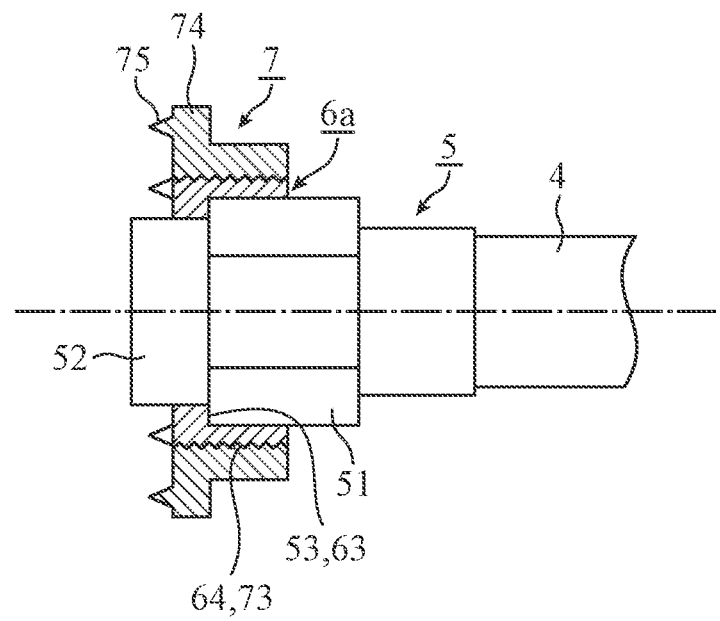

FIG. 15 is an explanatory diagram illustrating a state in after the first conductive member is inserted into a second conductive member.

Figure 16:
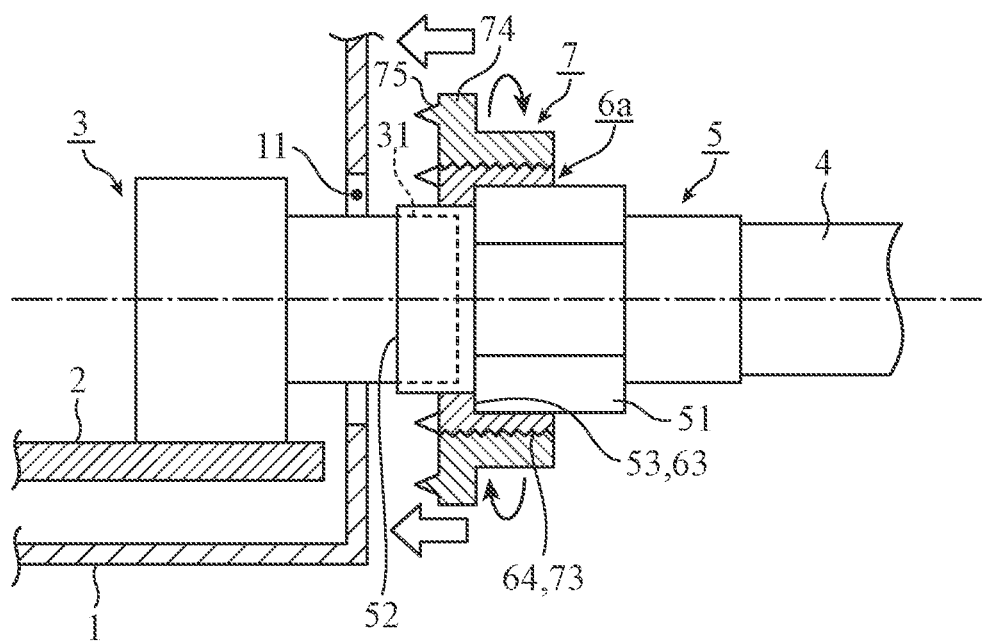

FIG. 16 is an explanatory diagram illustrating a state after the plug is connected to a jack and before the second conductive member is joined to a metal housing.

Figure 17:
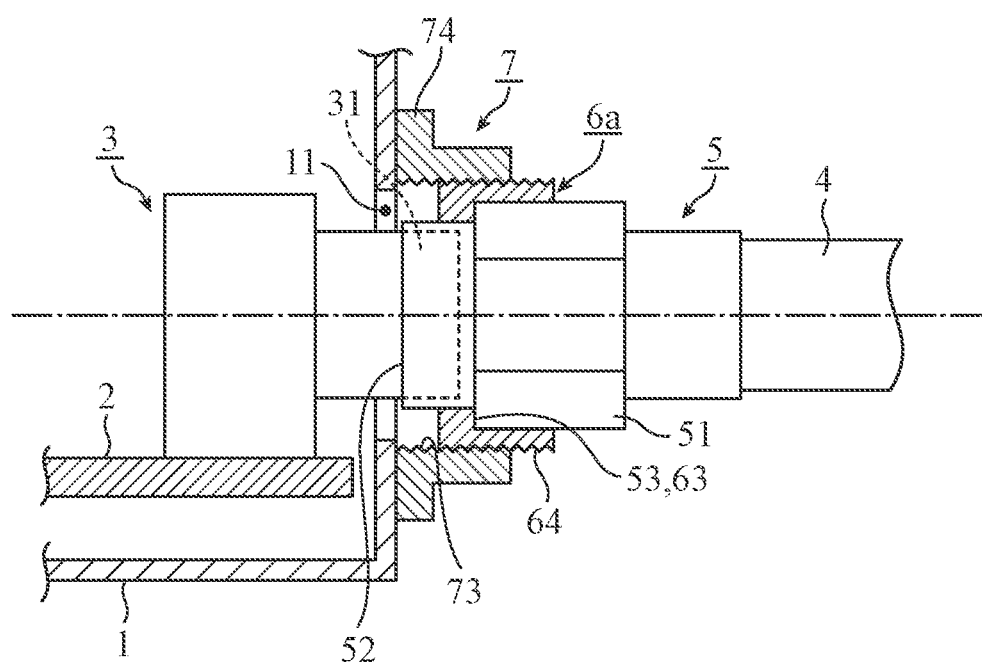

FIG. 17 is an explanatory diagram illustrating a state after the plug is connected to the jack and after the second conductive member is joined to the metal housing.

Figure 18:
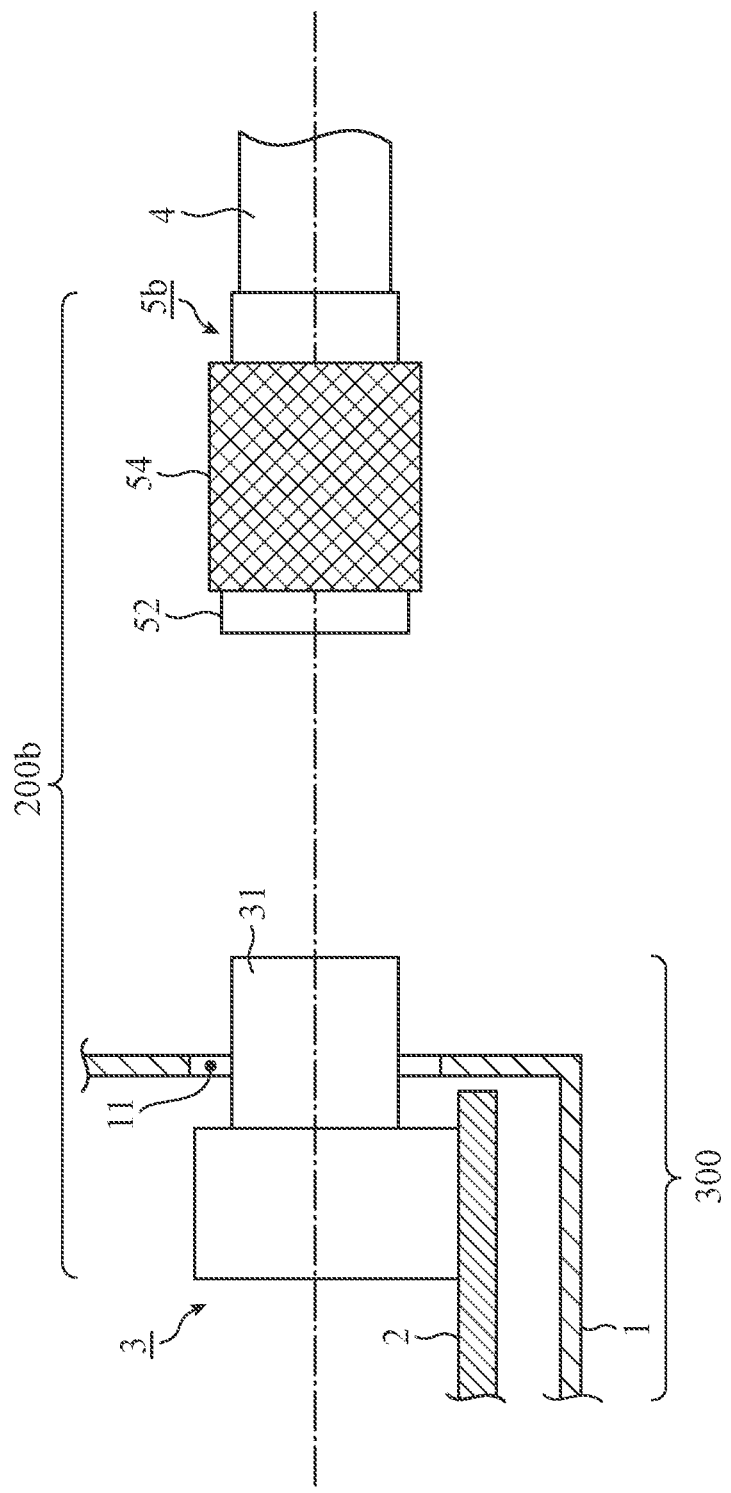

FIG. 18 is an explanatory diagram illustrating a main part of a connector on which an anti-noise component according to a third embodiment is to be mounted, in a state before a plug is connected to a jack.

Figure 19:
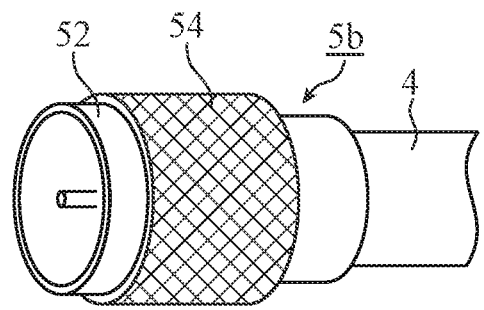

FIG. 19 is a perspective view illustrating the plug of the connector on which the anti-noise component according to the third embodiment is to be mounted.

Figure 20:
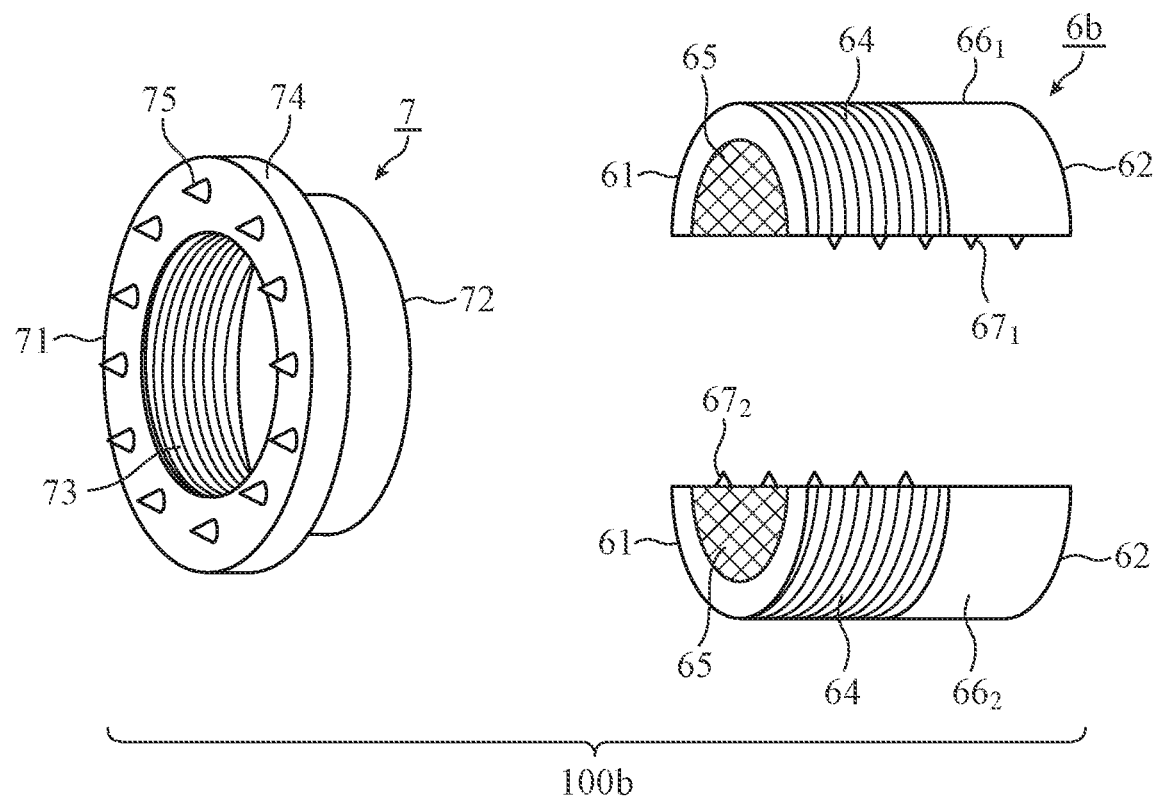

FIG. 20 is an exploded perspective view of a main part of the anti-noise component according to the third embodiment.

Figure 21A:
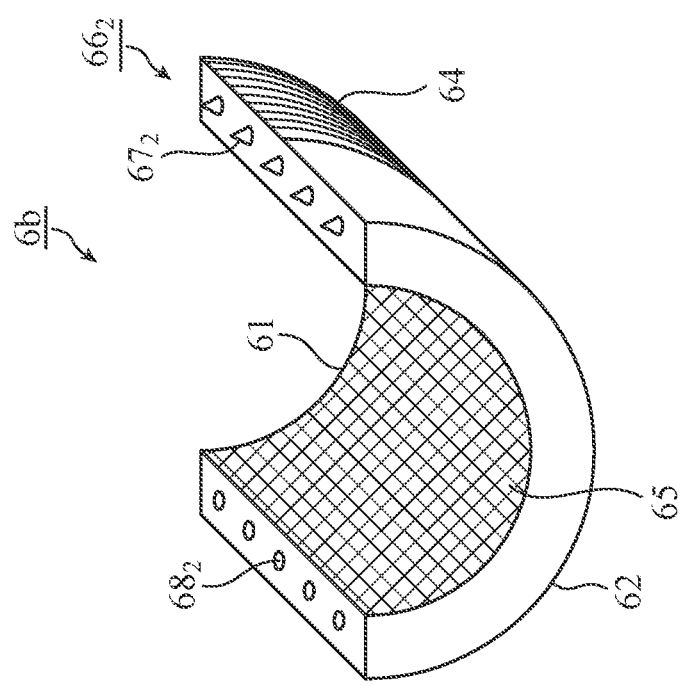

FIG. 21A is a perspective view illustrating a first component of a first conductive member of the anti-noise component according to the third embodiment.

Figure 21B:
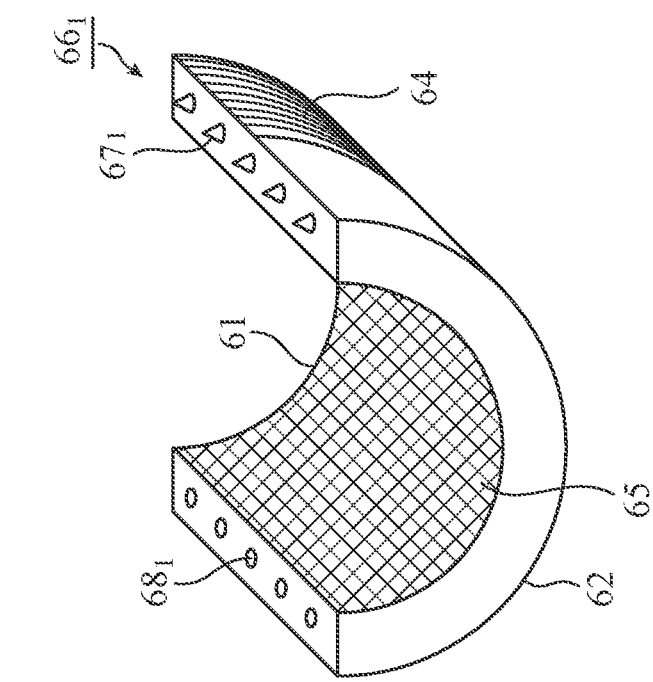

FIG. 21B is a perspective view illustrating a second component of the first conductive member of the anti-noise component according to the third embodiment.

Figure 22:
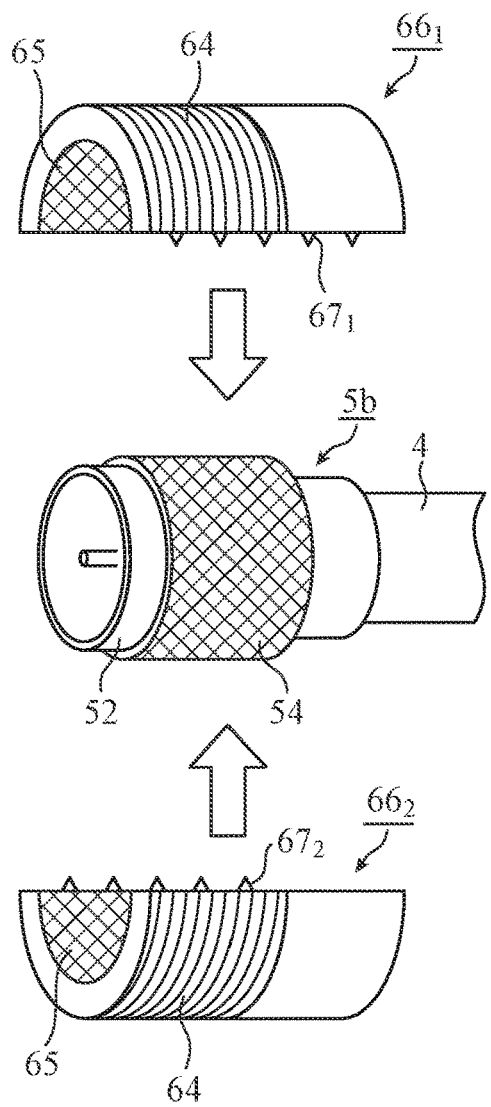

FIG. 22 is an explanatory diagram illustrating a state before the plug is held by the first conductive member.

Figure 23:
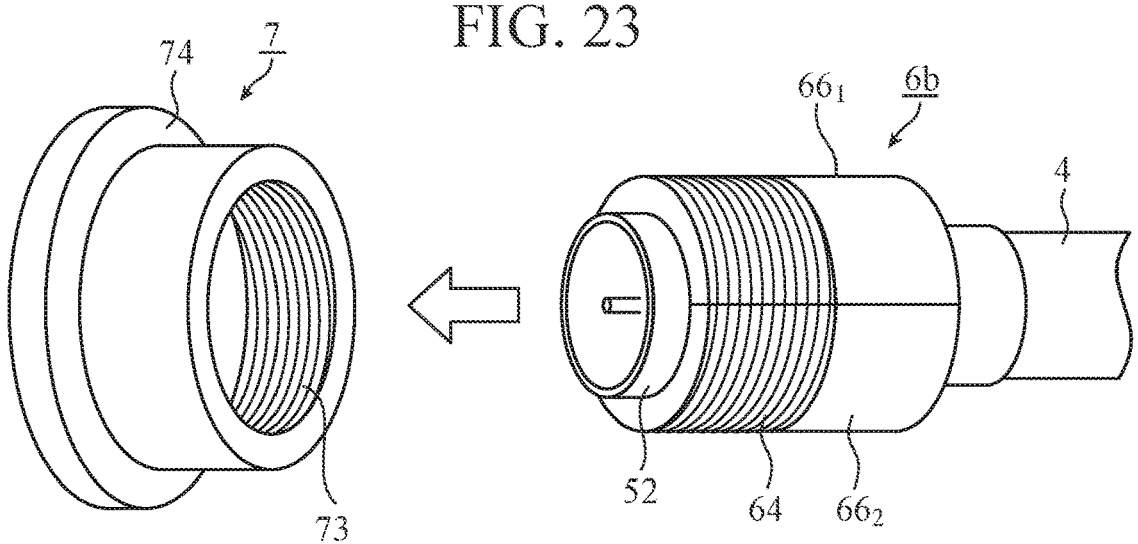

FIG. 23 is an explanatory diagram illustrating a state after the plug is held by the first conductive member and before the first conductive member is inserted into a second conductive member.

Figure 24:
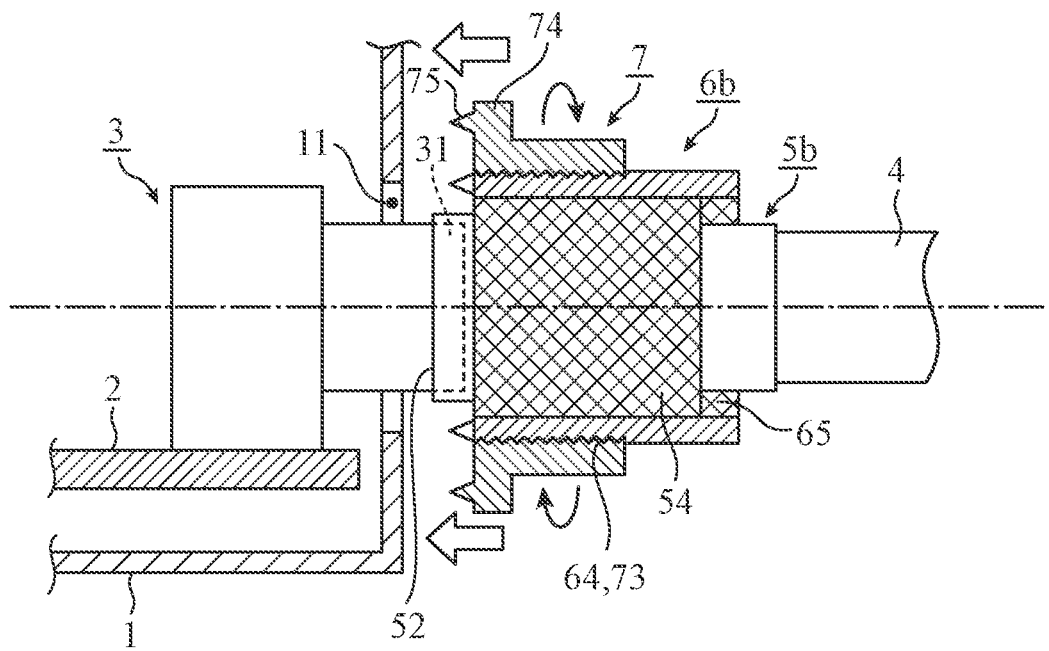

FIG. 24 is an explanatory diagram illustrating a state after the plug is connected to the jack and before the second conductive member is joined to a metal housing.

Figure 25:
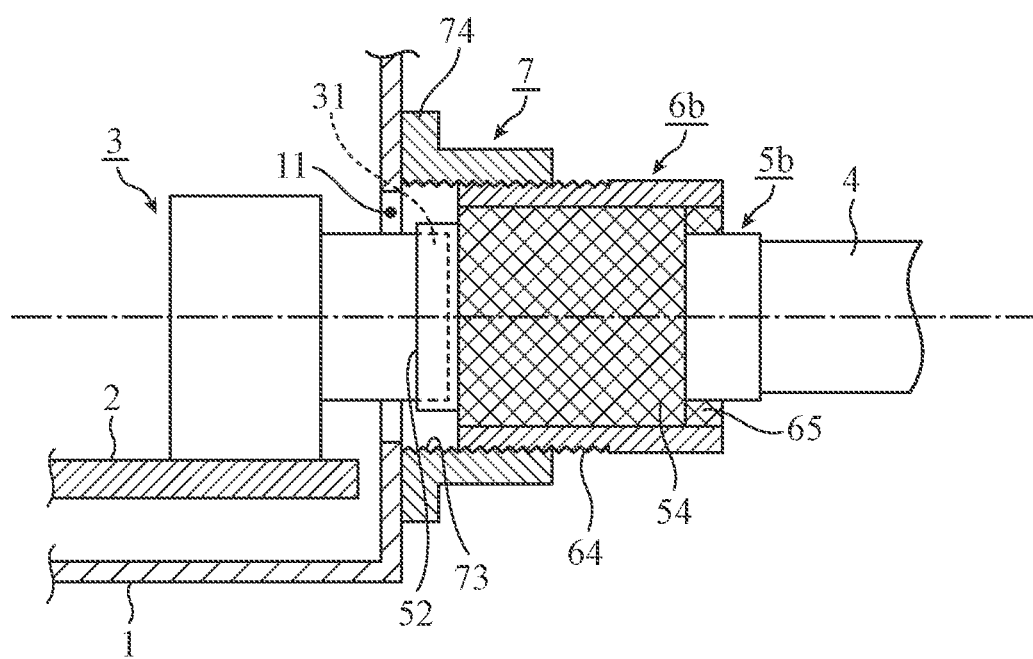

FIG. 25 is an explanatory diagram illustrating a state after the plug is connected to the jack and after the second conductive member is joined to the metal housing.

Figure 26:
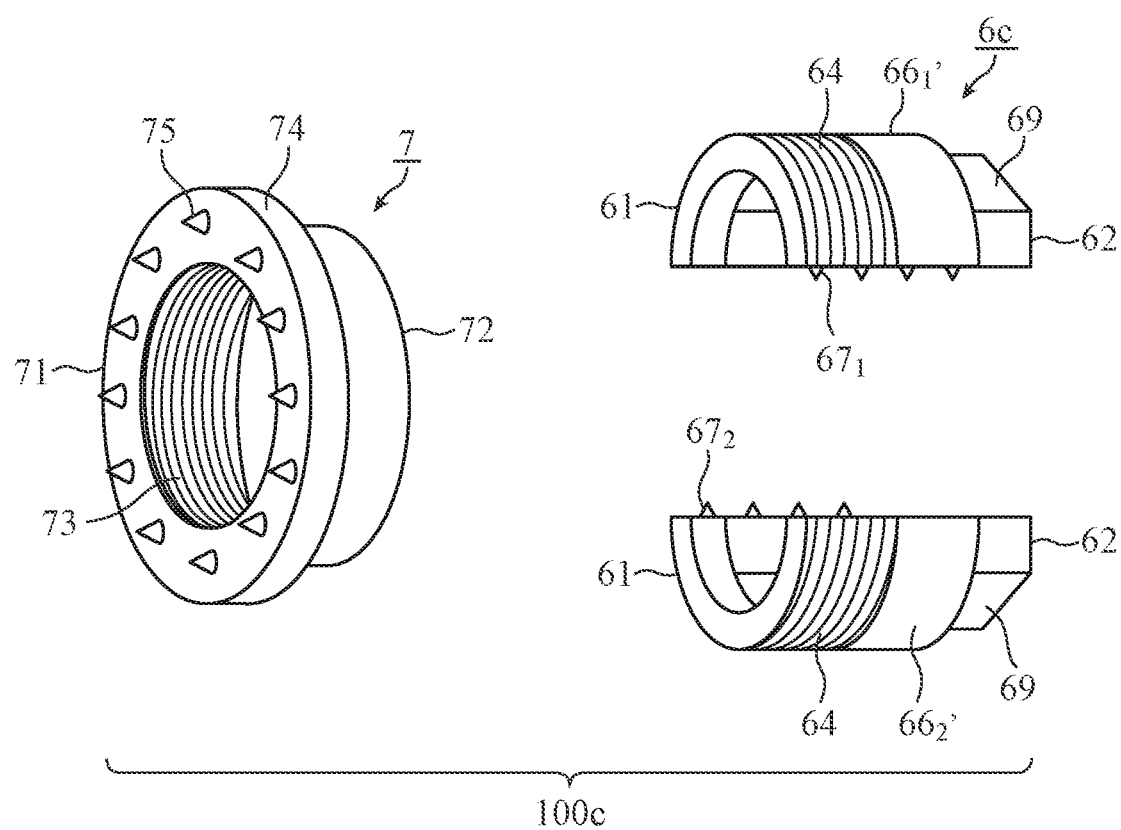

FIG. 26 is an exploded perspective view of a main part of an anti-noise component according to a fourth embodiment.

Figure 27:
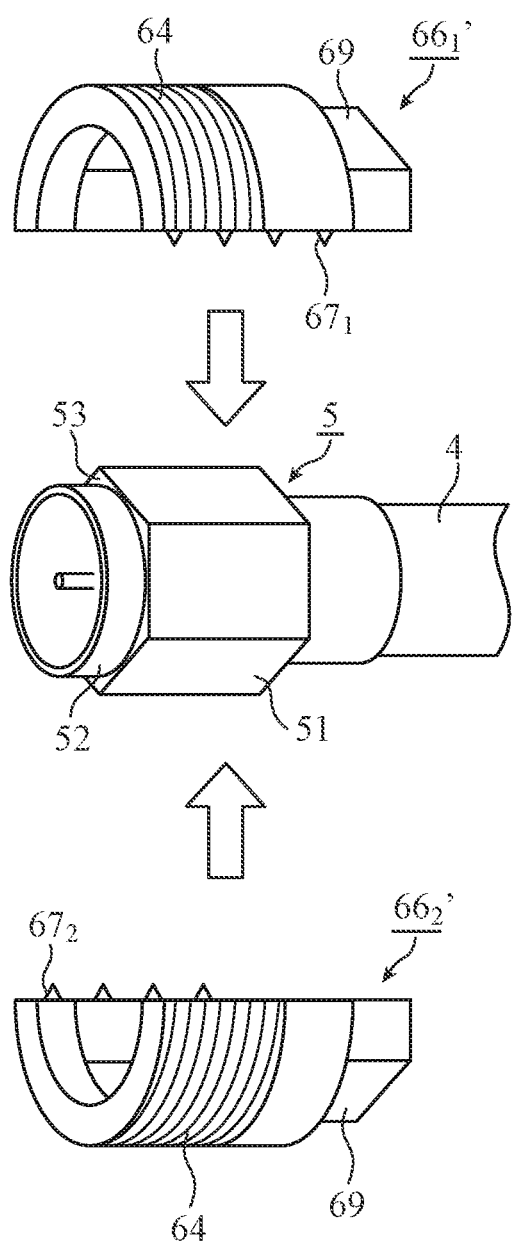

FIG. 27 is an explanatory diagram illustrating a state before a plug is held by a first conductive member.

Figure 28:
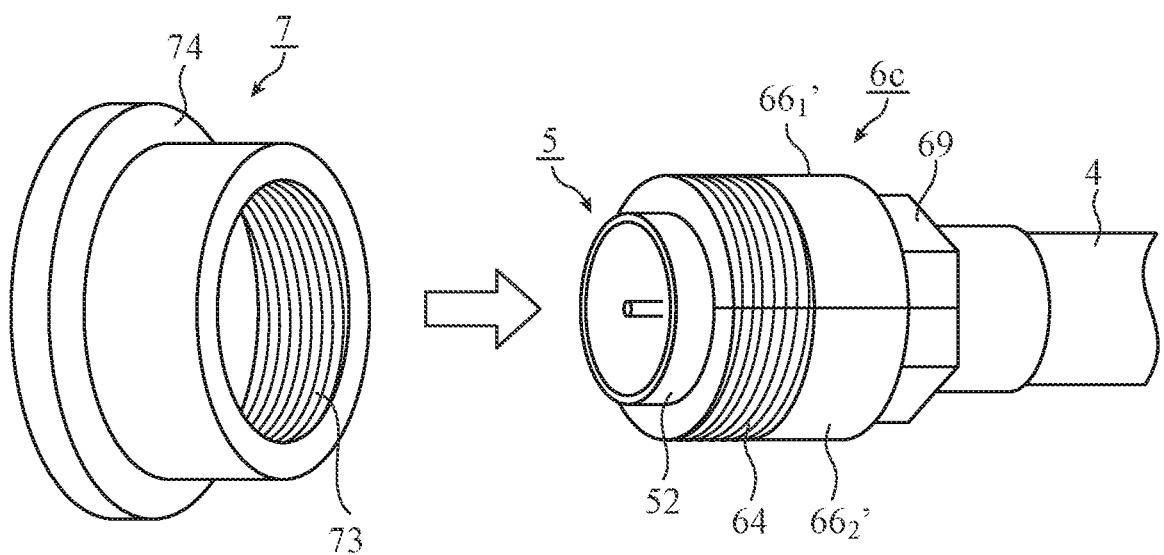

FIG. 28 is an explanatory diagram illustrating a state after the plug is held by the first conductive member and before the first conductive member is inserted into a second conductive member.

Figure 29:
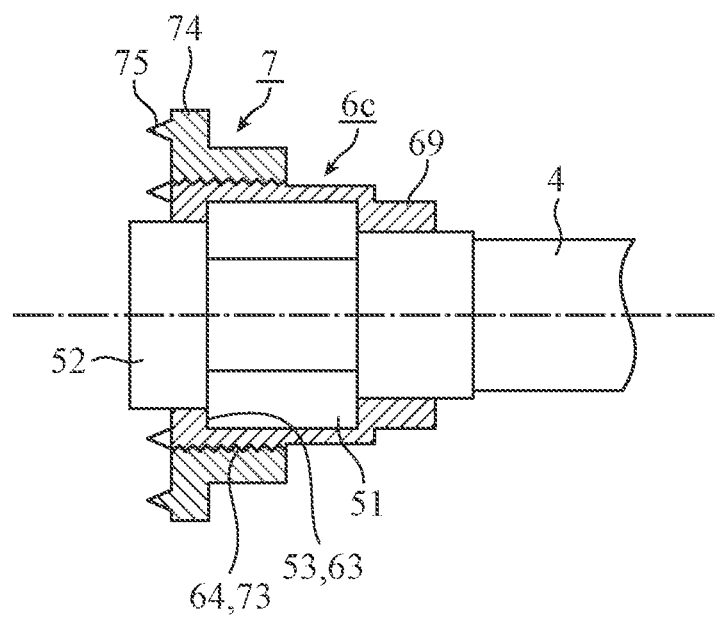

FIG. 29 is an explanatory diagram illustrating a state after the first conductive member is inserted into the second conductive member.

Figure 30:
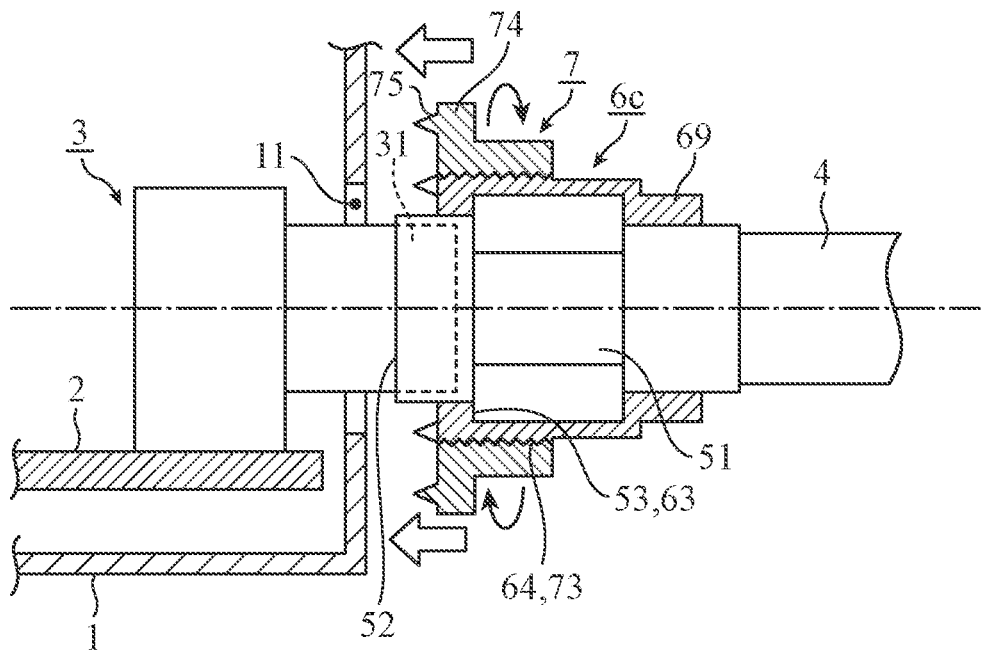

FIG. 30 is an explanatory diagram illustrating a state after the plug is connected to a jack and before the second conductive member is joined to a metal housing.

Figure 31:
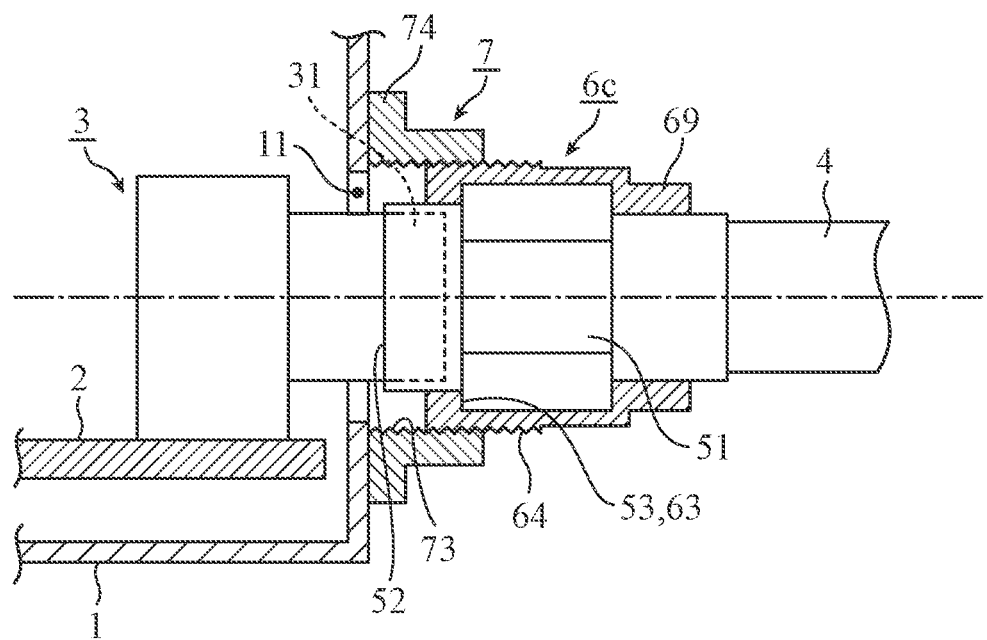

FIG. 31 is an explanatory diagram illustrating a state after the plug is connected to the jack and after the second conductive member is joined to the metal housing.

DESCRIPTION OF EMBODIMENTS

Embodiments for carrying out the invention will now be described with reference to the accompanying drawings for more detailed explanation of the invention.

First Embodiment

Figure 1:
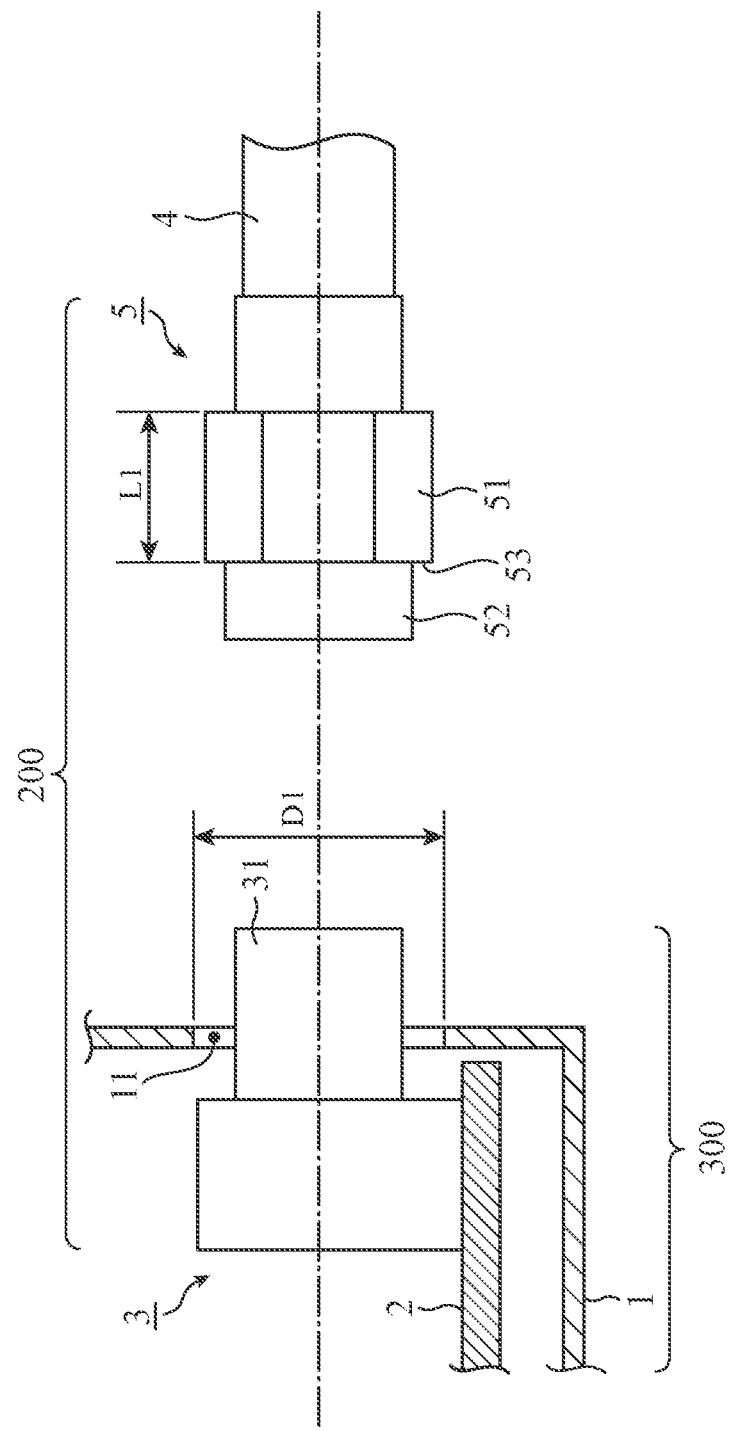
FIG. 1 is an explanatory diagram illustrating a main part of a connector on which an anti-noise component according to a first embodiment is to be mounted, in a state before a plug is connected to a jack.
Figure 2:
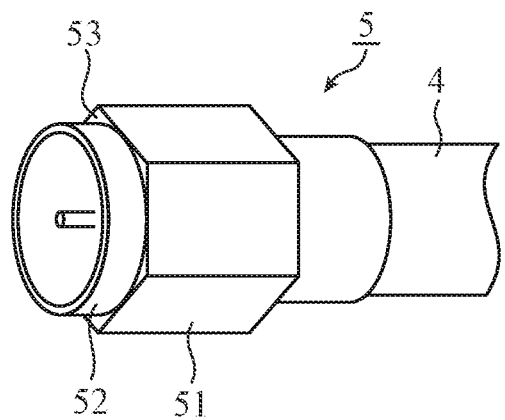
FIG. 2 is a perspective view illustrating the plug of the connector on which the anti-noise component according to the first embodiment is to be mounted.

FIG. 1 is an explanatory diagram illustrating a main part of a connector on which an anti-noise component according to a first embodiment is to be mounted, in a state before a plug is connected to a jack. FIG. 2 is a perspective view illustrating the plug of the connector on which the anti-noise component according to the first embodiment is to be mounted. A connector 200 on which an anti-noise component 100 according to the first embodiment is to be mounted will be described with reference to FIGS. 1 and 2.

In FIG. 1, a reference numeral 1 represents a metal housing. A circuit board 2 is provided in the metal housing 1, and a jack 3 is mounted on the circuit board 2. The jack 3 is inserted in an opening 11 of the metal housing 1. An end portion 31 of the jack 3 thus protrudes out of the metal housing 1.

The metal housing 1, the circuit board 2, and the jack 3 constitute a main part of a main unit of an electronic device 300. The electronic device 300 processes high-frequency signals. More specifically, the electronic device 300 processes RF signals. A coaxial cable 4 is used to input RF signals to the electronic device 300 or to output RF signals by the electronic device 300.

A plug 5 is provided on the end portion of the coaxial cable 4. The jack 3 and the plug 5 constitute a main part of the connector 200. In the example illustrated in FIGS. 1 and 2, the connector 200 is a Sub Miniature Type A (SMA) connector. Thus, the plug 5 includes a hexagonal connecting nut 51. In addition, an end portion 52 of the plug 5 protrudes from the connecting nut 51. A stepped portion 53 is thus formed between the connecting nut 51 and the end portion 52.

In FIG. 1, L1 represents a dimension of the connecting nut 51 in the axial direction (hereinafter referred to as an "axial length"). In addition, D1 represents a dimension of the opening 11 (hereinafter referred to as an "opening diameter".

Figure 3:
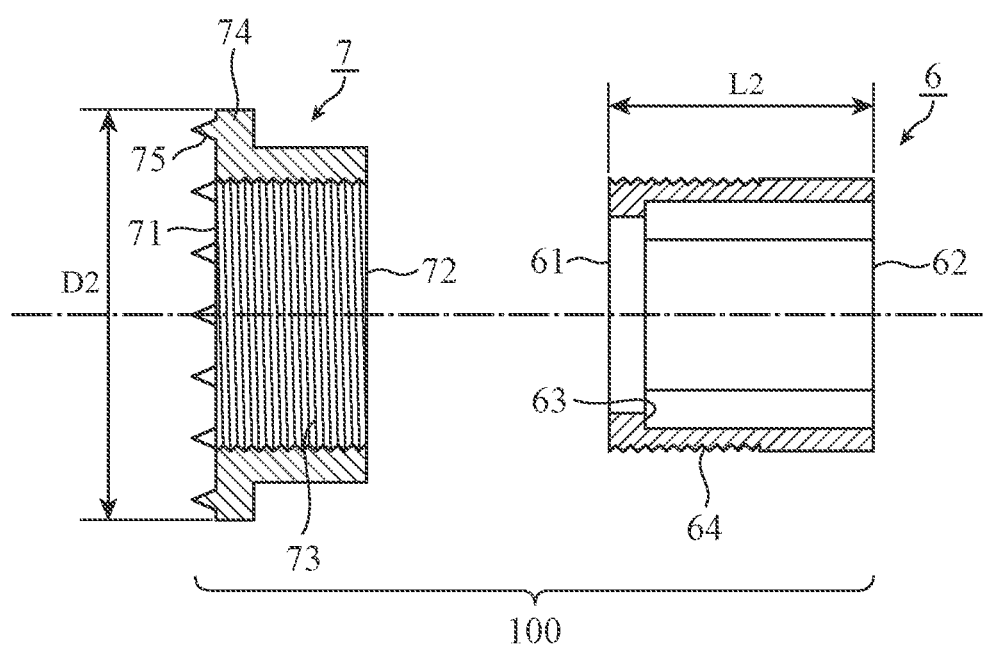
FIG. 3 is an exploded sectional view illustrating a main part of the anti-noise component according to the first embodiment.
Figure 4:
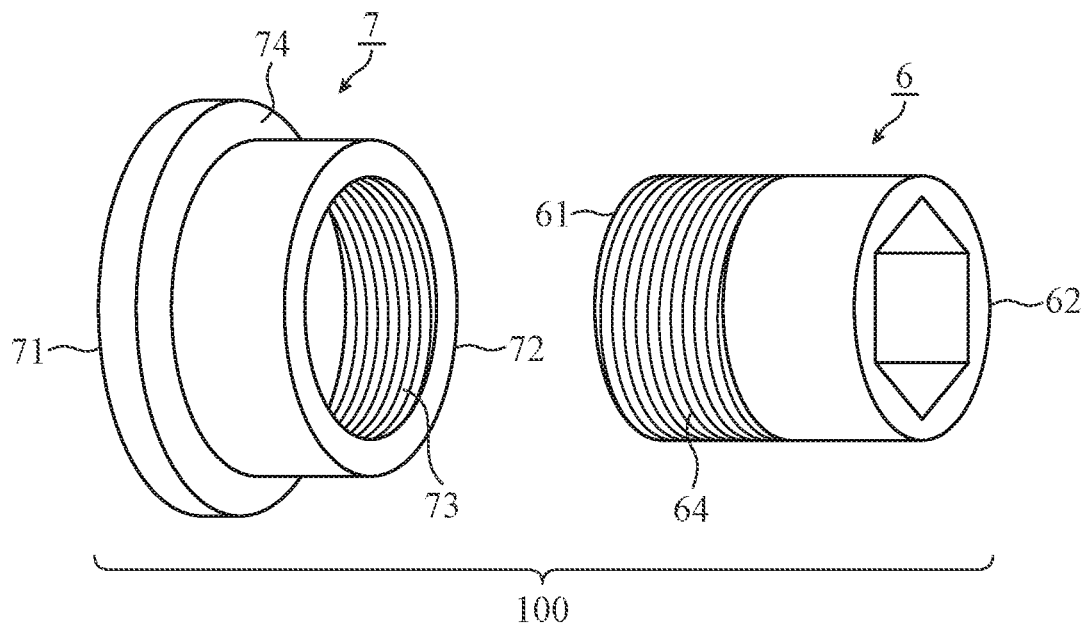
FIG. 4 is an exploded perspective view of the main part of the anti-noise component according to the first embodiment.
Figure 5:
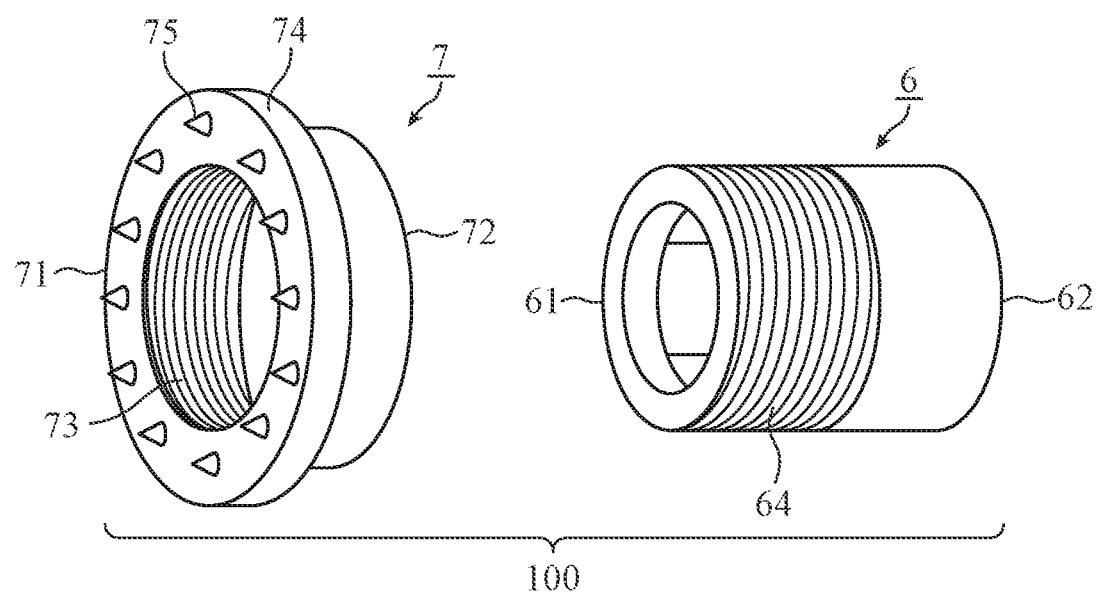
FIG. 5 is another exploded perspective view of the main part of the anti-noise component according to the first embodiment.

FIG. 3 is an exploded sectional view illustrating a main part of the anti-noise component according to the first embodiment. FIG. 4 is an exploded perspective view of the main part of the anti-noise component according to the first embodiment. FIG. 5 is another exploded perspective view of the main part of the anti-noise component according to the first embodiment. The anti-noise component 100 according to the first embodiment will be described with reference to FIGS. 3 to 5.

As illustrated in FIGS. 3 to 5, the anti-noise component 100 is constituted by a pair of conductive members 6 and 7 having substantially cylindrical shapes. Hereinafter, one conductive member 6 of the pair of conductive members 6 and 7 will be referred to as a "first conductive member", and the other conductive member 7 will be referred to as a "second conductive member". In addition, one end 61 of the ends 61 and 62 of the first conductive member 6 will be referred to as a "first end", and the other end 62 will be referred to as a "second end". In addition, one end 71 of the ends 71 and 72 of the second conductive member 7 will be referred to as a "first end", and the other end 72 will be referred to as a "second end". Thus, the first end 61 is an end on the same side as the first end 71, and the second end 62 is an end on the same side as the second end 72.

The plug 5 is inserted into the first conductive member 6. A holding portion for the plug 5 is formed on the inner circumferential portion of the first conductive member 6.

Specifically, the inner circumferential portion of the first conductive member 6 has a shape corresponding to the shape of the connecting nut 51. In the example illustrated in FIGS. 3 to 5, because the connecting nut 51 has a hexagonal shape, the inner circumferential portion of the first conductive member 6 also has a hexagonal shape. In addition, a stepped portion (hereinafter referred to as a "stopper portion") 63 corresponding to the stepped portion 53 is formed at the inner circumferential portion of the first conductive member 6.

When the plug 5 is inserted into the first conductive member 6 through the second end 62, the outer circumferential portion of the connecting nut 51 comes in contact with the inner circumferential portion of the first conductive member 6, and the stepped portion 53 comes in contact with the stopper portion 63. In this manner, the plug 5 is fitted into the first conductive member 6. As a result, the plug 5 is held by the first conductive member 6. In addition, in this state, the end portion 52 of the plug 5 protrudes out of the first conductive member 6 through the first end 61.

The holding portion for the plug 5 is formed in this manner.

The first conductive member 6 is inserted into the second conductive member 7. Specifically, an external thread portion 64 is formed on an outer circumferential portion of the first conductive member 6, and an internal thread portion 73 on an inner circumferential portion of the second conductive member 7. The external thread portion 64 can be screwed into engagement with the internal thread portion 73.

In FIG. 3, L2 represents the axial length of the first conductive member 6. The axial length L2 of the first conductive member 6 is set to a value larger than the axial length L1 of the connecting nut 51 (see FIG. 1). Thus, when the plug 5 is inserted into the first conductive member 6, the whole or substantially the whole of the connecting nut 51 is located inside the first conductive member 6. In addition, the external thread portion 64 is formed on substantially a half, on the first end 61 side, of the outer circumferential portion of the first conductive member 6.

In addition, a flange portion 74 is formed at the first end 71 of the second conductive member 7. A joining portion to be joined to an outer face of the metal housing 1 is formed on the flange portion 74.

Specifically, in the example illustrated in FIGS. 3 to 5, the flange portion 74 has a substantially disc-like shape, and a plurality of projections 75 is formed on the flange portion 74. In FIG. 3, D2 represents the diameter of the flange portion 74. The diameter D2 of the flange portion 74 is set to a value larger than the opening diameter D1 of the opening 11 (see FIG. 1). The joining portion to be joined to the outer face of the metal housing 1 is thus formed.

Next, a method for connecting the coaxial cable 4 to the electronic device 300 and mounting the anti-noise component 100 onto the connector 200 will be explained with reference to FIGS. 6 to 12.

Figure 6:
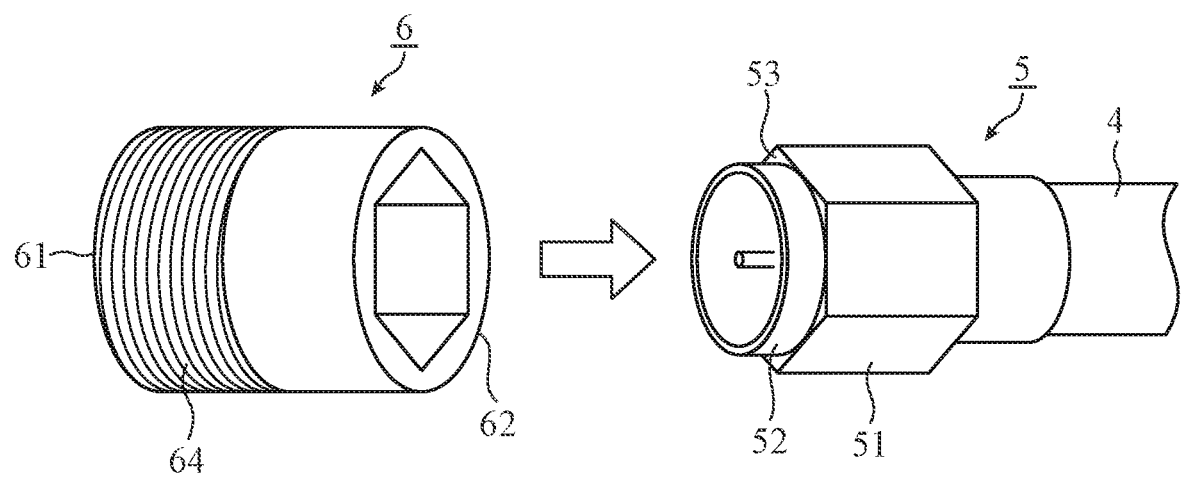
FIG. 6 is an explanatory diagram illustrating a state before the plug is inserted into a first conductive member.
Figure 7A:
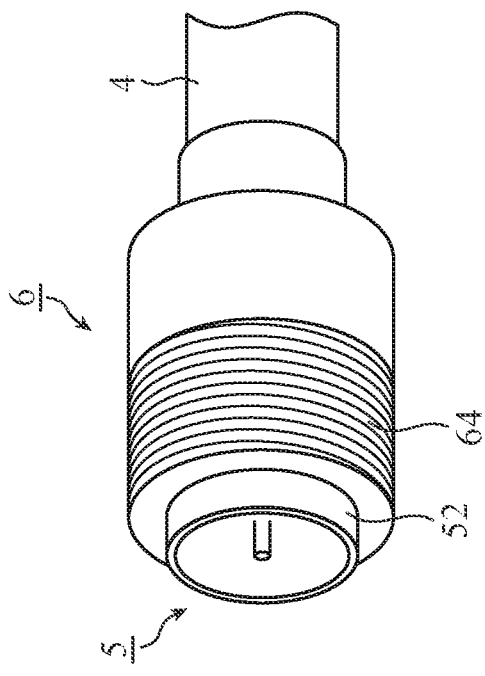
FIG. 7A is an explanatory diagram illustrating a state after the plug is inserted into the first conductive member. FIG.
Figure 7B:
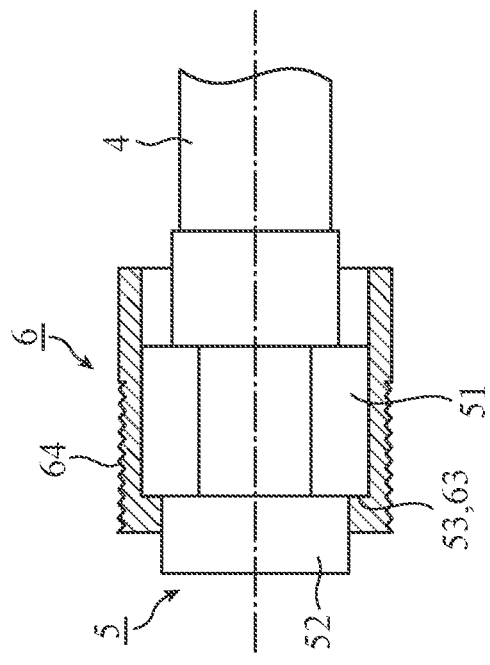

First, as illustrated in FIG. 6, a user inserts the plug 5 into the first conductive member 6 through the second end 62. As a result, as illustrated in FIG. 7, the plug 5 is in a state of being inserted in the first conductive member 6.

At this point, because the inner circumferential portion of the first conductive member 6 has a hexagonal shape, the outer circumferential portion of the connecting nut 51 is in contact with the inner circumferential portion of the first conductive member 6. In addition, the stepped portion 53 is in contact with the stopper portion 63. In other words, the plug 5 is fitted into the first conductive member 6. In this manner, the plug 5 is held in the first conductive member 6.

Subsequently, as illustrated in FIG. 8, the user screws the external thread portion 64 into the internal thread portion 73 to insert the first conductive member 6 into the second conductive member 7. As a result, as illustrated in FIG. 9, the external thread portion 64 is in engagement with the internal thread portion 73, that is, the first conductive member 6 is inserted in the second conductive member 7.

Subsequently, as illustrated in FIG. 10, the user inserts the end portion 52 of the plug 5 into the end portion 31 of the jack 3. Subsequently, the user turns the first conductive member 6 relative to the jack 3. As a result, the second conductive member 7 turns integrally with the first conductive member 6. In addition, as the connecting nut 51 turns integrally with the first conductive member 6, the plug 5 turns integrally with the first conductive member 6.

The turning of the plug 5 relative to the jack 3 screws an external thread portion (not illustrated) formed on an outer circumferential portion of the end portion 31 of the jack 3 into engagement with an internal thread portion (not illustrated) formed on an inner circumferential portion of the end portion 52 of the plug 5. As a result, as illustrated in FIG. 11, the plug 5 is connected with the jack 3.

Subsequently, the user turns the second conductive member 7 relative to the first conductive member 6. The turning direction in this process is opposite the turning direction of the external thread portion 64 being screwed into engagement with the internal thread portion 73. As a result, the second conductive member 7 moves in the axial direction. More specifically, the second conductive member 7 moves in the direction toward the metal housing 1.

The movement of the second conductive member 7 in this direction brings the projections 75 in engagement with the outer face of the metal housing 1 and the flange portion 74 in contact or substantially in contact with the outer face of the metal housing 1 as illustrated in FIGS. 11 and 12. Thus, the second conductive member 7 is joined to the metal housing 1, and the second conductive member 7 is electrically connected with the metal housing 1.

As a result, the connection of the coaxial cable 4 to the electronic device 300 is completed, and the mounting of the anti-noise component 100 onto the connector 200 is completed.

Next, effects of the anti-noise component 100 will be explained.

Typically, the plug 5 is made of metal, and electrically connected with an external conductor (not illustrated) of the coaxial cable 4. In the state in which the mounting of the anti-noise component 100 onto the connector 200 is completed, the metal housing 1, the plug 5, the first conductive member 6, and the second conductive member 7 are electrically connected with each other. In this manner, occurrence of electromagnetic noise leakage through the opening 11 can be avoided. As a result, occurrence of electromagnetic noise on other electronic devices can be reduced.

In addition, the anti-noise component 100 complies with the coaxial cable 4 with the plug 5. Thus, no special processing is needed on an end portion of the coaxial cable 4 when connecting the coaxial cable 4 to the electronic device 300. In addition, because the processing is not needed on RF signal transmission lines, the quality of transmission of RF signals can be improved.

In addition, the anti-noise component 100 is to be electrically connected with the external conductor (more specifically, the plug 5) of the coaxial cable 4 outside of the metal housing 1, and to be electrically connected with the metal housing 1 outside of the metal housing 1. This eliminates the need for works inside the metal housing 1 when the anti-noise component 100 is mounted onto the connector 200. Thus, the metal housing 1 need not be opened and closed when the anti-noise component 100 is mounted onto the connector 200.

Next, modifications of the anti-noise component 100 and the connector 200 will be described.

First, the connector 200 is not limited to an SMA connector, but may be of any type. For example, the connector 200 may be an N-type connector. Thus, instead of the connecting nut 51 provided on the plug 5, knurling may be performed on an outer circumferential portion of the plug 5.

In addition, the holding portion for the plug 5 at the inner circumferential portion of the first conductive member 6 may be in any form adapted to the type of the connector 200 and is not limited to the specific examples mentioned above. For example, in the case where the connector 200 is an N-type connector, the holing portion for the plug 5 may be formed by knurling the inner circumferential portion of the first conductive member 6. Specifically, the plug 5 may be held by the first conductive member 6 in such a manner that the knurled portion at the outer circumferential portion of the plug 5 and the knurled portion at the inner circumferential portion of the first conductive member 6 are in engagement with each other.

In addition, the joining portion of the flange portion 74 to be joined to the outer face of the metal housing 1 may have any shape that enables the joining, and is not limited to the specific example mentioned above. For example, the joining portion may be formed in such a manner that the flange portion 74 has a substantially disc-like shape and that one projection 75 is formed on the flange portion 74. Alternatively, for example, the joining portion may be formed in such a manner that the flange portion 74 has a shape of a tooth lock washer.

In addition, the shape of the first conductive member 6 may have a substantially cylindrical shape as mentioned above, and need not have a perfectly cylindrical shape. In addition, the shape of the second conductive member 7 may have a substantially cylindrical shape having the flange portion 74 as described above, and need not have a perfectly cylindrical shape. The meaning of the term "cylindrical" used in the claims of the present application covers such subsequently cylindrical shapes.

As described above, the anti-noise component 100 of the first embodiment is an anti-noise component 100 for the connector 200 including the plug 5 provided on the end portion of the coaxial cable 4 and the jack 3 provided at the opening 11 of the metal housing 1 of the electronic device 300, the anti-noise component 100 includes the cylindrical first conductive member 6 into which the plug 5 is inserted and the cylindrical second conductive member 7 into which the first conductive member 6 is inserted, the holding portion for the plug 5 is formed on the inner circumferential portion of the first conductive member 6, the external thread portion 64 is formed on the outer circumferential portion of the first conductive member 6, the internal thread portion 73 is formed on the inner circumferential portion of the second conductive member 7, the external thread portion 64 can be screwed into engagement with the internal thread portion 73, the flange portion 74 is formed at the first end 71 of the second conductive member 7, and the joining portion to be joined to the outer face of the metal housing 1 is formed on the flange portion 74. In this manner, occurrence of electromagnetic noise leakage through the opening 11 can be avoided. As a result, occurrence of electromagnetic noise on other electronic devices can be reduced. In addition, the need for works for applying special processing on the end portion of the coaxial cable 4, works for opening and closing the metal housing 1, and the like in connecting the coaxial cable 4 to the electronic device 300, that is, in mounting the anti-noise component 100 onto the connector 200 can be eliminated. Consequently, works required in connecting the coaxial cable 4, that is, in mounting the anti-noise component 100 can be simplified.

Second Embodiment

FIG. 13 is an exploded sectional view illustrating a main part of an anti-noise component according to a second embodiment. An anti-noise component 100a according to the second embodiment will be described with reference to FIG. 13. Note that, in FIG. 13, components that are similar to those illustrated in FIGS. 3 to 5 are designated by the same reference numerals, and the description thereof will not be repeated. In addition, because the connector 200 on which the anti-noise component 100a is to be mounted is similar to the connector 200 on which the anti-noise component 100 is to be mounted, the description thereof will not be repeated.

As illustrated in FIG. 13, the anti-noise component 100a is constituted by a first conductive member 6a and the second conductive member 7. In the anti-noise component 100a, the axial length L2a of the first conductive member 6a differs from the axial length L2 of the first conductive member 6 (see FIG. 3).

Specifically, the axial length L2a of the first conductive member 6a is set to a value smaller than the axial length L1 of the connecting nut 51 (see FIG. 1). Specifically, for example, the axial length L2a of the first conductive member 6a is set to a value that is substantially a half of the axial length L1 of the connecting nut 51. Thus, when the plug 5 is inserted into the first conductive member 6 through the second end 62, substantially a half (hereinafter referred to as a "first half part") of the connecting nut 51 is located inside the first conductive member 6 and the remaining substantial half (hereinafter referred to as a "second half part") of the connecting nut 51 protrudes out of the first conductive member 6 through the second end 62. In addition, the external thread portion 64 is formed on the whole or substantially the whole of the outer circumferential portion of the first conductive member 6.

Next, a method for connecting the coaxial cable 4 to the electronic device 300 and mounting the anti-noise component 100a onto the connector 200 will be explained with reference to FIGS. 14 to 17.

First, the user inserts the plug 5 into the first conductive member 6a through the second end 62. As a result, as illustrated in FIG. 14, the plug is inserted in the first conductive member 6a. At this point, as described above, the first half part of connecting nut 51 is located inside the first conductive member 6a, and the second half part of the connecting nut 51 protrudes out of the first conductive member 6a through the second end 62.

Subsequently, the user screws the external thread portion 64 into the internal thread portion 73 to insert the first conductive member 6a into the second conductive member 7. As a result, as illustrated in FIG. 15, the external thread portion 64 is into engagement with the internal thread portion 73, that is, the first conductive member 6a is inserted in the second conductive member 7.

Subsequently, the user inserts the end portion 52 of the plug 5 into the end portion 31 of the jack 3. Subsequently, the user places a torque wrench on the second half part of the connecting nut 51 to turn the connecting nut 51 relative to the jack 3. As a result, the plug 5, the first conductive member 6, and the second conductive member 7 turn integrally with each other. Use of the torque wrench enables these members to be turned with any torque.

The turning of the plug 5 relative to the jack 3 screws an external thread portion (not illustrated) formed on an outer circumferential portion of the end portion 31 of the jack 3 into engagement with an internal thread portion (not illustrated) formed on an inner circumferential portion of the end portion 52 of the plug 5. As a result, as illustrated in FIG. 16, the plug 5 is connected with the jack 3.

Subsequently, the user turns the second conductive member 7 relative to the plug 5 and the first conductive member 6a. The turning direction in this process is opposite the turning direction of the external thread portion 64 being screwed into engagement with the internal thread portion 73. As a result, the second conductive member 7 moves in the axial direction. More specifically, the second conductive member 7 moves in the direction toward the metal housing 1.

The movement of the second conductive member 7 in this direction brings the projections 75 in engagement with the outer face of the metal housing 1 and the flange portion 74 in contact or substantially in contact with the outer face of the metal housing 1 as illustrated in FIGS. 16 and 17. Thus, the second conductive member 7 is joined to the metal housing 1, and the second conductive member 7 is electrically connected with the metal housing 1.

As a result, the connection of the coaxial cable 4 to the electronic device 300 is completed, and the mounting of the anti-noise component 100a onto the connector 200 is completed.

Note that the axial length L2a of the first conductive member 6a may be any value smaller than the axial length L1 of the connecting nut 51, and is not limited to the value that is substantially a half of the axial length L1 of the connecting nut 51. The axial length L2a of the first conductive member 6a is, however, preferably set to a suitable value in terms of making the amount by which the connecting nut 51 protrudes from the first conductive member 6a be sufficiently large to enable placement of the torque wrench.

In addition, for the anti-noise component 100a, various modifications similar to those described in the first embodiment, that is, various modifications similar to those of the anti-noise component 100 can be adopted.

As described above, in the anti-noise component 100a of the second embodiment, the connector 200 is of a type in which the plug 5 includes the connecting nut 51, and the axial length L2a of the first conductive member 6a is set to a value smaller than the axial length L1 of the connecting nut 51. This enables use of a torque wrench to turn the plug 5. As a result, turning with any torque can be achieved.

Third Embodiment

FIG. 18 is an explanatory diagram illustrating a main part of a connector on which an anti-noise component according to a third embodiment is to be mounted, in a state before a plug is connected to a jack. FIG. 19 is a perspective view illustrating the plug of the connector on which the anti-noise component according to the third embodiment is to be mounted. A connector 200b on which an anti-noise component 100b according to the third embodiment is to be mounted will be described with reference to FIGS. 18 and 19. Note that, in FIGS. 18 and 19, components that are similar to those illustrated in FIGS. 1 and 2 are designated by the same reference numerals, and the description thereof will not be repeated.

As illustrated in FIGS. 18 and 19, the connector 200b is an N-type connector. Thus, a knurled portion 54 is provided on an outer circumferential portion of a plug 5b.

FIG. 20 is an exploded perspective view of a main part of the anti-noise component according to the third embodiment. FIG. 21A is a perspective view illustrating a first component of a first conductive member of the anti-noise component according to the third embodiment. FIG. 21B is a perspective view illustrating a second component of the first conductive member of the anti-noise component according to the third embodiment. The anti-noise component 100b according to the third embodiment will be described with reference to FIGS. 20 and 21.

As illustrated in FIGS. 20 and 21, a knurled portion 65 is provided on an inner circumferential portion of a first conductive member 6b. In this manner, a holding portion for the plug 5b is formed.

In addition, the first conductive member 6b is constituted by a pair of components $66_1$ and $66_2$ having substantially semi-cylindrical shapes. A projecting portion (hereinafter referred to as a "first projecting portion") and a recessed portion (hereinafter referred to as a "first recessed portion") are formed on a joining face of one component (hereinafter referred to as a "first component") $66_1$ to be joined to the other component (hereinafter referred to as a "second component") $66_2$. Similarly, a projecting portion (hereinafter referred to as a "second projecting portion") and a recessed portion (hereinafter referred to as a "second recessed portion") are formed on a joining face of the second component $66_2$ to be joined to the first component $66_1$.

In the example illustrated in FIGS. 20 and 21, the first projecting portion is constituted by a plurality of projections $67_1$, and the second recessed portion is constituted by a plurality of holes $68_2$. The projections $67_1$ are associated one-to-one with the holes $68_2$. Thus, each of the projections $67_1$ can be fitted to the associated one of the holes $68_2$.

Similarly, in the example illustrated in FIGS. 20 and 21, the second projecting portion is constituted by a plurality of projections $67_2$, and the first recessed portion is constituted by a plurality of holes $68_1$. The projections $67_2$ are associated one-to-one with the holes $68_1$. Thus, each of the projections $67_2$ can be fitted to the associated one of the holes $68_1$.

The anti-noise component 100b is structured as described above.

Next, a method for connecting the coaxial cable 4 to the electronic device 300 and mounting the anti-noise component 100b onto the connector 200b will be explained with reference to FIGS. 22 to 25.

First, as illustrated in FIG. 22, the user fits each of the projections $67_1$ and $67_2$ into the associated one of the holes $68_1$ and $68_2$ with the plug 5b between the components $66_1$ and $66_2$, so that the components $66_1$ and $66_2$ are joined together. As a result, as illustrated in FIG. 23, the plug 5b is held between the components $66_1$ and $66_2$. In other words, the knurled portion 54 is into engagement with the knurled portion 65.

Subsequently, as illustrated in FIG. 23, the user screws the external thread portion 64 into the internal thread portion 73 to insert the first conductive member 6b into the second conductive member 7. As a result, as illustrated in FIG. 24, the external thread portion 64 is in engagement with the internal thread portion 73, that is, the first conductive member 6b is inserted in the second conductive member 7.

Subsequently, the user inserts the end portion 52 of the plug 5b into the end portion 31 of the jack 3. Subsequently, the user turns the first conductive member 6b relative to the jack 3. As a result, the second conductive member 7 turns integrally with the first conductive member 6b. In addition, because the knurled portion 54 is in engagement with the knurled portion 65, the plug 5b turns integrally with the first conductive member 6b.

The turning of the plug 5b relative to the jack 3 screws an external thread portion (not illustrated) formed on an outer circumferential portion of the end portion 31 of the jack 3 into engagement with an internal thread portion (not illustrated) formed on an inner circumferential portion of the end portion 52 of the plug 5b. As a result, as illustrated in FIG. 24, the plug 5b is connected with the jack 3.

Subsequently, as illustrated in FIG. 24, the user turns the second conductive member 7 relative to the first conductive member 6b. The turning direction in this process is opposite the turning direction of the external thread portion 64 being screwed into engagement with the internal thread portion 73. As a result, the second conductive member 7 moves in the axial direction. More specifically, the second conductive member 7 moves in the direction toward the metal housing 1.

The movement of the second conductive member 7 in this direction brings the projections 75 in engagement with the outer face of the metal housing 1 and the flange portion 74 in contact or substantially in contact with the outer face of the metal housing 1 as illustrated in FIG. 25. Thus, the second conductive member 7 is joined to the metal housing 1, and the second conductive member 7 is electrically connected with the metal housing 1.

As a result, the connection of the coaxial cable 4 to the electronic device 300 is completed, and the mounting of the anti-noise component 100b onto the connector 200b is completed.

Note that the knurled portion 65 may be provided on an inner circumferential portion of at least one of the first component $66_1$ and the second component $66_2$. In addition, the knurled portion 65 may be provided on at least part of the inner circumferential portion.

In addition, the axial length of the first conductive member 6b may be set to a value similar to that of the axial length L2 of the first conductive member 6 or may be set to a value similar to that of the axial length L2a of the first conductive member 6a, for example. In other words, the axial length of the first conductive member 6b may be set to a value as large as the axial length L2 or may be set a value as small as the axial length L2a.

In addition, the first projecting portion is not limited to the projections 6'71. For example, the first projecting portion may be constituted by one projection 6'71, a plurality of elongated projections, or one elongated projection. In addition, the second recessed portion may be in any form associated with the first projecting portion, and is not limited to the holes $68_2$. For example, the second recessed portion may be constituted by one hole $68_2$, a plurality of grooves, or one groove.

In addition, the second projecting portion is not limited to the projections $67_2$. For example, the second projecting portion may be constituted by one projection $67_2$, a plurality of elongated projections, or one elongated projection. In addition, the first recessed portion may be in any form associated with the second projecting portion, and is not limited to the holes $68_1$. For example, the first recessed portion may be constituted by one hole $68_1$, a plurality of grooves, or one groove.

In addition, the components $66_1$ and $66_2$ may not include the second projecting portion and the first recessed portion. In other words, the components $66_1$ and $66_2$ may include only the first projecting portion and the second recessed portion.

In addition, the components $66_1$ and $66_2$ may not include the first projecting portion and the second recessed portion. In other words, the components $66_1$ and $66_2$ may include only the second projecting portion and the first recessed portion.

In addition, the first component $66_1$ may have a substantially semi-cylindrical shape as mentioned above, and need not have a perfectly semi-cylindrical shape. In addition, the second component $66_2$ need may have a substantially semi-cylindrical shape as mentioned above, and need not have a perfectly semi-cylindrical shape. The meaning of the term "semi-cylindrical" used in the claims of the present application covers such subsequently semi-cylindrical shapes.

In addition, in a manner similar to the first conductive member 6b of the anti-noise component 100b, the first conductive member 6 of the anti-noise component 100 may be constituted by a pair of substantially semi-cylindrical components (that is, the first component and the second component). Specifically, the first conductive member 6 adapted to the SMA connector 200 may be constituted by the first component and the second component.

In addition, in a manner similar to the first conductive member 6b of the anti-noise component 100b, the first conductive member 6a of the anti-noise component 100a may be constituted by a pair of substantially semi-cylindrical components (that is, the first component and the second component). Specifically, the first conductive member 6a adapted to the SMA connector 200 may be constituted by the first component and the second component.

Additionally, for the anti-noise component 100b, various modifications similar to those described in the first embodiment, that is, various modifications similar to those of the anti-noise component 100 can be adopted. In addition, for the anti-noise component 100b, various modifications similar to those described in the second embodiment, that is, various modifications similar to those of the anti-noise component 100a can be adopted.

As described above, the anti-noise component 100b of the third embodiment is an anti-noise component 100b for the connector 200b including the plug 5b provided on the end portion of the coaxial cable 4 and the jack 3 provided at the opening 11 of the metal housing 1 of the electronic device 300, the anti-noise component 100b includes the cylindrical first conductive member 6b by which the plug 5b is held and the cylindrical second conductive member 7 into which the first conductive member 6b is inserted, the holding portion for the plug 5b is formed on the inner circumferential portion of the first conductive member 6b, the external thread portion 64 is formed on the outer circumferential portion of the first conductive member 6b, the internal thread portion 73 is formed on the inner circumferential portion of the second conductive member 7, the external thread portion 64 can be screwed into engagement with the internal thread portion 73, the flange portion 74 is formed at the first end 71 of the second conductive member 7, and the joining portion to be joined to the outer face of the metal housing 1 is formed on the flange portion 74. In this manner, occurrence of electromagnetic noise leakage through the opening 11 can be avoided. As a result, occurrence of electromagnetic noise on other electronic devices can be reduced. In addition, the need for works for applying special processing on the end portion of the coaxial cable 4, works for opening and closing the metal housing 1, and the like in connecting the coaxial cable 4 to the electronic device 300, that is, in mounting the anti-noise component 100b onto the connector 200b can be eliminated. Consequently, works required in connecting the coaxial cable 4, that is, in mounting the anti-noise component 100b can be simplified.

In addition, in the anti-noise component 100b of the third embodiment, the first conductive member 6b is constituted by a pair of components $66_1$ and $66_2$ having semi-cylindrical shapes, and the plug 5b is held between the components $66_1$ and $66_2$. As a result, the anti-noise component 100b that complies with the N-type connector 200b, for example, can be achieved.

Fourth Embodiment

FIG. 26 is an exploded perspective view of a main part of an anti-noise component according to a fourth embodiment. An anti-noise component 100c according to the fourth embodiment will be described with reference to FIG. 26. Note that, in FIG. 26, components that are similar to those illustrated in FIGS. 3 to 5 are designated by the same reference numerals, and the description thereof will not be repeated. In addition, because a connector 200 on which the anti-noise component 100c is to be mounted is similar to the connector 200 on which the anti-noise component 100 is to be mounted, the description thereof will not be repeated.

As illustrated in FIG. 26, a first conductive member 6c is constituted by a pair of components $66_1'$ and $66_2'$ having substantially semi-cylindrical shapes. Specifically, the first conductive member 6c is constituted by a first component 66i' and a second component $66_2'$.

The first component 66i' has a first projecting portion and a first recessed portion, and the second component $66_2'$ has a second projecting portion and a second recessed portion. The first projecting portion is constituted by a plurality of projections $67_1$, for example. The first recessed portion is constituted by a plurality of holes $68_1$ (not illustrated), for example. The second projecting portion is constituted by a plurality of projections $67_2$, for example. The second recessed portion is constituted by a plurality of holes $68_2$ (not illustrated), for example.

An inner circumferential portion of the first conductive member 6c has a shape corresponding to the shape of the plug 5. In this manner, a holding portion for the plug 5 is formed.

Note that a portion (hereinafter referred to as a "polygonal portion") 69 having a shape corresponding to the shape of the connecting nut 51 is formed at a second end 62 of the first conductive member 6c. In the example illustrated in FIG. 26, the connecting nut 51 has a hexagonal shape, and thus the polygonal portion 69 also has a hexagonal shape. In addition, the polygonal portion 69 has the same size as the connecting nut 51.

Thus, for turning the first conductive member 6c, the user can place a wrench on the polygonal portion 69 to turn the first conductive member 6c with the wrench. In this process, the user can use a typical torque wrench for SMA connectors, that is, a 5/16-inch torque wrench. As a result, turning with any torque can be achieved.

The anti-noise component 100c is structured as described above.

Next, a method for connecting the coaxial cable 4 to the electronic device 300 and mounting the anti-noise component 100c onto the connector 200 will be explained with reference to FIGS. 27 to 31.

First, as illustrated in FIG. 27, the user fits each of the projections $67_1$ and $67_2$ into the associated one of the holes $68_1$ and $68_2$ (not illustrated) with the plug 5 between the components 66i' and $66_2'$, so that the components 66i' and $66_2'$ are joined together. As a result, as illustrated in FIG. 28, the plug 5 is held between the components 66i' and $66_2'$.

Subsequently, as illustrated in FIG. 28, the user screws the external thread portion 64 into the internal thread portion 73 to insert the first conductive member 6c into the second conductive member 7. As a result, as illustrated in FIG. 29, the external thread portion 64 is into engagement with the internal thread portion 73, that is, the first conductive member 6c is inserted in the second conductive member 7.

Subsequently, the user inserts the end portion 52 of the plug 5 into the end portion 31 of the jack 3. Subsequently, the user places a wrench on the polygonal portion 69 to turn the first conductive member 6c relative to the jack 3. Thus, the second conductive member 7 turns integrally with the first conductive member 6c, and the plug 5 turns integrally with the first conductive member 6c.

The turning of the plug 5 relative to the jack 3 screws an external thread portion (not illustrated) formed on an outer circumferential portion of the end portion 31 of the jack 3 into engagement with an internal thread portion (not illustrated) formed on an inner circumferential portion of the end portion 52 of the plug 5. As a result, as illustrated in FIG. 30, the plug 5 is connected with the jack 3.

Subsequently, as illustrated in FIG. 30, the user turns the second conductive member 7 relative to the first conductive member 6c. The turning direction in this process is opposite the turning direction of the external thread portion 64 being screwed into engagement with the internal thread portion 73. As a result, the second conductive member 7 moves in the axial direction. More specifically, the second conductive member 7 moves in the direction toward the metal housing 1.

The movement of the second conductive member 7 in this direction brings the projections 75 in engagement with the outer face of the metal housing 1 and the flange portion 74 in contact or substantially in contact with the outer face of the metal housing 1 as illustrated in FIG. 31. Thus, the second conductive member 7 is joined to the metal housing 1, and the second conductive member 7 is electrically connected with the metal housing 1.

As a result, the connection of the coaxial cable 4 to the electronic device 300 is completed, and the mounting of the anti-noise component 100c onto the connector 200 is completed.

Note that the shape and the size of the polygonal portion 69 may be any shape and size with which the first conductive member 6c can be turned with a wrench, and are not limited to the specific example described above. As described above, however, in terms of allowing use of a typical torque wrench for SMA connectors, the shape and the size of the polygonal portion 69 are more preferably set to a shape and a size corresponding to those of the connecting nut 51.

Additionally, for the anti-noise component 100c, various modifications similar to those described in the first embodiment, that is, various modifications similar to those of the anti-noise component 100 can be adopted. In addition, for the anti-noise component 100c, various modifications similar to those described in the second embodiment, that is, various modifications similar to those of the anti-noise component 100a can be adopted. In addition, for the anti-noise component 100c, various modifications similar to those described in the third embodiment, that is, various modifications similar to those of the anti-noise component 100b can be applied.

As described above, according to the anti-noise component 100c of the fourth embodiment, the polygonal portion 69 for a wrench is formed at the second end 62 of the first conductive member 6c. This enables use of a wrench to turn the first conductive member 6c. As a result, a torque wrench can be used to achieve turning with any torque. In addition, this enables so-called "retightening".

Note that the embodiments of the present invention can be freely combined, any components in the embodiments can be modified, and any components in the embodiments can be omitted within the scope of the invention of the present application.

INDUSTRIAL APPLICABILITY

An anti-noise component of the present invention can be used for electronic devices that process RF signals, for example.

REFERENCE SIGNS LIST

1: metal housing, 2: circuit board, 3: jack, 4: coaxial cable, 5, 5b: plug, 6, 6a, 6b, 6c: conductive member (first conductive member), 7: conductive member (second conductive member), 11: opening, 31: end portion, 51: connecting nut, 52: end portion, 53: stepped portion, 54: knurled portion, 61: end (first end), 62: end (second end), 63: stopper portion, 64: external thread portion, 65: knurled portion, $66_1$: component (first component), $66_1'$: component (first component), $66_2$: component (second component), $66_2'$: component (second component), $67_1$: projection, $67_2$: projection, $68_1$: hole, $68_2$: hole, 69: polygonal portion, 71: end (first end), 72: end (second end), 73: internal thread portion, 74: flange portion, 75: projection, 100, 100a, 100b, 100c: anti-noise component, 200, 200b: connector, 300: electronic device

The invention claimed is:

1. An anti-noise component for a connector including a plug provided on an end of a coaxial cable, and a jack provided at an opening of a metal housing of an electronic device, the anti-noise component comprising:
    a first conductive member having a cylindrical shape, the plug being inserted into or held by the first conductive member, and a second conductive member having a cylindrical shape, the first conductive member being inserted into the second conductive member, wherein
    a holder for the plug is formed on an inner circumferential portion of the first conductive member,
    an external thread is formed on an outer circumferential portion of the first conductive member, an internal thread is formed on an inner circumferential portion of the second conductive member, and the external thread can be screwed into engagement with the internal thread, and
    a flange is formed at a first end of the second conductive member, and a junction to be joined to an outer face of the metal housing is formed on the flange.

2. The anti-noise component according to claim 1, wherein
    the connector is of a type with the plug including a connecting nut, and
    the first conductive member has an axial length set to a value smaller than an axial length of the connecting nut.

3. The anti-noise component according to claim 1, wherein the first conductive member is constituted by a pair of components having semi-cylindrical shapes, and the plug is held between the components.

4. The anti-noise component according to claim 1, wherein a polygonal portion for a wrench is formed at a second end of the first conductive member.

* * * * *